United States Patent
Ito et al.

(10) Patent No.: US 11,796,247 B2
(45) Date of Patent: Oct. 24, 2023

(54) TEMPERATURE CONTROL SYSTEM

(71) Applicants: CKD CORPORATION, Aichi (JP);
EBARA CORPORATION, Tokyo (JP);
EBARA REFRIGERATION EQUIPMENT & SYSTEMS CO., LTD., Tokyo (JP)

(72) Inventors: Akihiro Ito, Aichi (JP); Norio Kokubo, Aichi (JP); Masayuki Kouketsu, Aichi (JP); Isahiro Hasegawa, Aichi (JP); Toshiharu Nakazawa, Tokyo (JP); Keisuke Takanashi, Tokyo (JP); Yukihiro Fukusumi, Tokyo (JP)

(73) Assignees: CKD CORPORATION, Aichi (JP);
EBARA CORPORATION, Tokyo (JP);
EBARA REFRIGERATION EQUIPMENT & SYSTEMS CO., LTD., Tokyo (JP)

( * ) Notice: Subject to any disclaimer, the term of this patent is extended or adjusted under 35 U.S.C. 154(b) by 81 days.

(21) Appl. No.: 17/100,227

(22) Filed: Nov. 20, 2020

(65) Prior Publication Data
US 2021/0148630 A1 May 20, 2021

(30) Foreign Application Priority Data
Nov. 20, 2019 (JP) ................................ 2019-209955

(51) Int. Cl.
*F25D 29/00* (2006.01)
*F25D 17/02* (2006.01)

(52) U.S. Cl.
CPC ........... *F25D 29/001* (2013.01); *F25D 17/02* (2013.01); *F25D 2303/085* (2013.01);
(Continued)

(58) Field of Classification Search
CPC .. F25D 29/001; F25D 17/02; F25D 2303/085; F25D 2400/34; F25D 2500/04;
(Continued)

(56) References Cited

U.S. PATENT DOCUMENTS

| 4,271,679 A | 6/1981 | Schäfer |
| 5,335,508 A | 8/1994 | Tippmann |

(Continued)

FOREIGN PATENT DOCUMENTS

| CN | 106196474 A | * 12/2016 | ............. F24F 11/30 |
| JP | H09-298192 A | 11/1997 | |

(Continued)

OTHER PUBLICATIONS

Office Action issued in related U.S. Appl. No. 17/092,891 dated Jan. 10, 2023 (25 pages).

(Continued)

*Primary Examiner* — Emmanuel E Duke
(74) *Attorney, Agent, or Firm* — Osha Bergman Watanabe & Burton LLP

(57) ABSTRACT

A temperature control system is used for controlling a temperature of a control target to a target temperature that changes with lapse of time. The system includes: a first adjustment apparatus that includes a first tank that stores a first heat transfer medium, adjusts the temperature of the first heat transfer medium to a first set temperature, and supplies the temperature-adjusted first heat transfer medium; a first circulation circuit through which the first heat transfer medium flows from the first adjustment apparatus to a first flow-through path and returns to the first adjustment apparatus; an adjustment section that adjusts an amount of heat supplied from the first flow-through path to the control target; a memory that stores a relation between the lapse of time and the target temperature; and a controller.

18 Claims, 11 Drawing Sheets

(52) U.S. Cl.
CPC ...... *F25D 2400/34* (2013.01); *F25D 2500/04* (2013.01); *F25D 2600/02* (2013.01); *F25D 2700/121* (2013.01); *F25D 2700/123* (2013.01); *F25D 2700/16* (2013.01)

(58) Field of Classification Search
CPC .......... F25D 2600/02; F25D 2700/121; F25D 2700/123; F25D 2700/16; G05D 23/1333; G05D 23/1904; G05D 23/20; G05D 23/1902; G05D 23/1919; G05D 23/32; H01L 21/67109; H01L 21/67248
See application file for complete search history.

(56) References Cited

U.S. PATENT DOCUMENTS

| | | | |
|---|---|---|---|
| 6,063,710 | A | 5/2000 | Kadomura et al. |
| 6,148,626 | A | 11/2000 | Iwamoto |
| 6,174,408 | B1 | 1/2001 | Kadomura et al. |
| 7,988,062 | B2 | 8/2011 | Nonaka et al. |
| 10,580,577 | B2 | 3/2020 | Akiyoshi |
| 2005/0252222 | A1 | 11/2005 | Jessen et al. |
| 2009/0118872 | A1 | 5/2009 | Nonaka et al. |
| 2010/0206519 | A1 | 8/2010 | Cho et al. |
| 2014/0262030 | A1 | 9/2014 | Buchberger, Jr. |
| 2014/0262199 | A1 | 9/2014 | Kobayashi et al. |
| 2018/0156474 | A1 | 6/2018 | Goransson |
| 2018/0374639 | A1 | 12/2018 | Akiyoshi |
| 2021/0140719 | A1 | 5/2021 | Ito et al. |
| 2021/0310688 | A1 | 10/2021 | Kato et al. |

FOREIGN PATENT DOCUMENTS

| | | | | |
|---|---|---|---|---|
| JP | 2716248 | B2 | | 2/1998 |
| JP | H11183005 | A | | 7/1999 |
| JP | 2000339038 | A | | 12/2000 |
| JP | 2001134324 | A | | 5/2001 |
| JP | 2011179757 | A | * | 9/2011 |
| JP | 4956672 | B2 | | 6/2012 |
| JP | 5032269 | B2 | | 9/2012 |
| JP | 2013-20509 | A | | 1/2013 |
| JP | 2013162097 | A | * | 8/2013 |
| JP | 5445766 | B2 | | 3/2014 |
| JP | 5445766 | B2 | * | 3/2014 |
| JP | 2015183993 | A | | 10/2015 |
| JP | 2018009746 | A | * | 1/2018 |
| JP | 2019009359 | A | | 1/2019 |
| KR | 20140114747 | A | * | 9/2014 ........... H01L 21/683 |
| TW | 201339781 | A | | 10/2013 |
| TW | 201339781 | A | * | 10/2013 ......... G05D 23/1934 |
| WO | 2007073091 | A1 | | 6/2007 |
| WO | 2012/066763 | A1 | | 5/2012 |
| WO | WO-2019021968 | A1 | * | 1/2019 ............. F16K 11/00 |

OTHER PUBLICATIONS

Office Action issued in related U.S. Appl. No. 17/093,002 dated Nov. 14, 2022 (17 pages).
Office Action issued in related Taiwanese Patent Application No. 109137322 dated Nov. 3, 2022 (14 pages).
Office Action issued in related U.S. Appl. No. 17/100,191 dated Sep. 30, 2022 (14 pages).
Office Action issued in corresponding Japanese Patent Application No. 2019-209955 dated Mar. 28, 2023 (9 pages).
Office Action issued in related Japanese Patent Application No. 2019-203218 dated Apr. 25, 2023 (5 pages).
Office Action issued in the counterpart Taiwanese Patent Application No. 109137323, dated May 2, 2023 (10 pages).
Office Action issued in counterpart Taiwanese Patent Application No. 109135962, dated Jun. 6, 2023 (10 pages).

* cited by examiner

TEMPERATURE CONTROL SYSTEM

CROSS REFERENCE TO RELATED APPLICATION

The present application is based on Japanese Patent Application No. 2019-209955 filed on Nov. 20, 2019, the entire content of which is incorporated herein by reference.

BACKGROUND

Technical Field

The present disclosure relates to a temperature control system for controlling the temperature of a control target.

Description of the Related Art

Conventionally, there has been known a cooling apparatus which detects the temperature of a cooling liquid supplied to an object to be cooled (supply-side detected temperature) and performs feedback control such that the supply-side detected temperature becomes equal to a target temperature (see Japanese Patent No. 5445766). The cooling apparatus disclosed in Japanese Patent No. 5445766 detects the temperature of the cooling liquid returned from the object to be cooled (return-side detected temperature), obtains the degree of change of the return-side detected temperature with time, and changes the control condition of the feedback control to a control condition corresponding to the degree of change. By virtue of the above-described configuration, highly accurate, stable temperature control can be secured even when the return-side detected temperature changes abruptly because of, for example, a change in the load of the object to be cooled.

Incidentally, the cooling apparatus (temperature control system) disclosed in Japanese Patent No. 5445766 changes the control condition of the feedback control after an abrupt change in the return-side detected temperature. Therefore, in the case where the load of the object to be cooled fluctuates or the target temperature changes, the disclosed cooling apparatus encounters a limitation in enabling the supply-side detected temperature to follow the target temperature. Meanwhile, in order to enhance followability of the supply-side detected temperature to the target temperature, the drive state of the cooling apparatus must be maintained at a high level at all times, thereby increasing the energy consumption of the cooling apparatus.

SUMMARY

One or more embodiments of the present invention provide a temperature control system which can enhance followability of the temperature of a control target to a target temperature while reducing energy consumption.

One or more embodiments provide a temperature control system for controlling the temperature of a control target to a target temperature which changes with lapse of time. The temperature control system comprises an adjustment apparatus which includes a tank for storing a heat transfer medium and which adjusts the temperature of the heat transfer medium to a set temperature and supplies the temperature-adjusted heat transfer medium; a circulation circuit through which the heat transfer medium flows from the adjustment apparatus to a flow-through section (i.e., flow-through path) capable of supplying heat to the control target and returns to the adjustment apparatus; an adjustment section which adjusts the amount of heat supplied from the flow-through section to the control target; a memory section (i.e., memory) in which the relation between lapse of time and the target temperature is stored beforehand; and a control section (i.e., controller). On the basis of the relation stored in the memory section, the control section sets the set temperature, at a point in time which precedes, by a predetermined time, a change timing at which the target temperature changes, such that the set temperature is set to a set temperature corresponding to a post-change target temperature which is a value of the target temperature after the change timing. The control section adjusts the amount of heat by using the adjustment section in order to control the temperature of the control target to a pre-change target temperature until the change timing, the pre-change target temperature being a value of the target temperature before the change timing.

According to the above-described configuration, the temperature control system controls the temperature of the control target to the target temperature which changes with lapse of time.

The adjustment apparatus includes a tank for storing the heat transfer medium. The adjustment apparatus adjusts the temperature of the heat transfer medium to the set temperature and supplies the temperature-adjusted heat transfer medium. Therefore, the adjustment apparatus can store in the tank the heat transfer medium whose temperature has been adjusted to the set temperature or a temperature close to the set temperature. Through the circulation circuit, the heat transfer medium flows from the adjustment apparatus to the flow-through section capable of supplying heat to the control target and returns to the adjustment apparatus. Therefore, the temperature of the control target can be controlled by causing the heat transfer medium to flow from the adjustment apparatus to the flow-through section, and supplying heat from the flow-through section to the control target. Notably, the expression "supplying heat to the control target" encompasses the case where the control target is cooled as a result of the supply of heat thereto and the case where the control target is heated as a result of the supply of heat thereto.

In the case where the target temperature of the control target changes with lapse of time, the temperature of the control target must be changed quickly to follow the target temperature. In view of this, on the basis of the relation between lapse of time and the target temperature stored in the memory section, the control section sets the set temperature, at a point in time which precedes, by a predetermined time, a change timing at which the target temperature changes, such that the set temperature is set to a set temperature corresponding to a post-change target temperature which is a value of the target temperature after the change timing. Therefore, by the change timing, the adjustment apparatus can store in the tank the heat transfer medium adjusted to the set temperature corresponding to the post-change target temperature. Accordingly, after the target temperature has changed, the adjustment apparatus can supply from the tank the heat transfer medium whose temperature has been adjusted beforehand, thereby enhancing the followability of the temperature of the control target to the target temperature. The only action required is to set the set temperature to a set temperature corresponding to the post-change target temperature at the point in time which precedes the change timing by the predetermined time, and maintaining the drive state of the adjustment apparatus at a high level at all times is unnecessary. Therefore, the energy consumption of the adjustment apparatus can be reduced.

In the case where the set temperature is set to a set temperature corresponding to the post-change target temperature at the point in time which precedes the change timing by the predetermined time, the temperature of the heat transfer medium supplied from the adjustment apparatus to the flow-through section changes from the temperature of the heat transfer medium before the set temperature has been changed. In view of this, in order to control the temperature of the control target to the pre-change target temperature until the change timing, the control section adjusts the amount of heat supplied from the flow-through section to the control target by using the adjustment section. Accordingly, even in the case where the set temperature is set to a set temperature corresponding to the post-change target temperature at the point in time which precedes the change timing by the predetermined time, it is possible to prevent deviation of the temperature of the control target from the target temperature.

In a second means, the temperature control system further comprises a temperature sensor for detecting the temperature of the heat transfer medium supplied from the adjustment apparatus. The control section sets the predetermined time on the basis of the post-change target temperature, the temperature of the heat transfer medium detected by the temperature sensor, a heat capacity from the adjustment apparatus to the control target, and an operating state of the adjustment apparatus.

The amount of heat which the adjustment apparatus must store in the tank beforehand by the change timing at which the target temperature changes correlates with the post-change target temperature of the control target, the current temperature of the heat transfer medium, and the heat capacity from the adjustment apparatus to the control target. Also, the time which the adjustment apparatus needs to store a required amount of heat in the tank correlates with the operating state of the adjustment apparatus.

In view of the forgoing, in the above-described configuration, the temperature of the heat transfer medium supplied from the adjustment apparatus is detected by the temperature sensor. The control section sets the predetermined time on the basis of the post-change target temperature of the control target, the temperature of the heat transfer medium detected by the temperature sensor, the heat capacity from the adjustment apparatus to the control target, and the operating state of the adjustment apparatus. Accordingly, the predetermined time can be set appropriately, whereby it becomes possible to reduce the energy consumption of the adjustment apparatus while enhancing the followability of the temperature of the control target to the target temperature.

In a third means, the control section sets the predetermined time under the assumption that the adjustment apparatus is operated such that its output becomes the maximum, and operates the adjustment apparatus at the maximum output during a period between the point in time which precedes the change timing by the predetermined time and the change timing. By virtue of such a configuration, the time which the adjustment apparatus requires to store a required amount of heat in the tank beforehand can be made the shortest, and the period of time during which ordinary control is performed; i.e., the set temperature of the adjustment apparatus is set to a set temperature corresponding to the target temperature, can be made longer. Accordingly, the accuracy in controlling of the temperature of the control target to the target temperature can be increased.

In a fourth means, the control section sets the predetermined time under the assumption that the adjustment apparatus is operated such that its operation efficiency becomes the maximum, and operates the adjustment apparatus such that its operation efficiency becomes the maximum during a period between the point in time which precedes the change timing by the predetermined time and the change timing. By virtue of such a configuration, when the adjustment apparatus stores a required amount of heat in the tank beforehand, the adjustment apparatus can be operated such that its operation efficiency becomes the maximum, whereby the energy consumption of the adjustment apparatus can be reduced.

In a fifth means, the adjustment section includes a first distribution valve which changes the ratio between the heat transfer medium flowing from the adjustment apparatus to the flow-through section and the heat transfer medium flowing out of the adjustment apparatus and returning to the adjustment apparatus without flowing through the flow-through section.

According to the above-described configuration, the first distribution valve changes the ratio between the heat transfer medium flowing from the adjustment apparatus to the flow-through section and the heat transfer medium flowing out of the adjustment apparatus and returning to the adjustment apparatus without flowing through the flow-through section. Therefore, the ratio between the amount of heat supplied from the adjustment apparatus to the flow-through section and the amount of heat returned to the adjustment apparatus can be changed by using the first distribution valve. Accordingly, the temperature of the control target can be controlled to the target temperature by changing the amount of heat supplied to the flow-through section by using the first distribution valve. Moreover, even in the case where the set temperature is set to a set temperature corresponding to the post-change target temperature at the point in time which precedes the change timing by the predetermined time, deviation of the temperature of the control target from the target temperature can be prevented by changing the amount of heat supplied to the flow-through section by using the first distribution valve.

In a sixth means, the adjustment apparatus is a first adjustment apparatus which includes a first tank for storing a first heat transfer medium and which adjusts the temperature of the first heat transfer medium to a first set temperature and supplies the temperature-adjusted first heat transfer medium, and the circulation circuit is a first circulation circuit through which the first heat transfer medium flows from the first adjustment apparatus to a first flow-through section (i.e., first flow-through path) capable of supplying heat to the control target and returns to the first adjustment apparatus. The temperature control system further comprises a second adjustment apparatus which adjusts the temperature of a second heat transfer medium to a second set temperature and supplies the temperature-adjusted second heat transfer medium; and a second circulation circuit through which the second heat transfer medium flows from the second adjustment apparatus to a second flow-through section (i.e., second flow-through path) capable of supplying heat to the control target and returns to the second adjustment apparatus. The adjustment section adjusts the amounts of heat supplied from the first flow-through section and the second flow-through section to the control target. On the basis of the relation stored in the memory section, the control section sets the first set temperature, at a point in time which precedes, by a predetermined time, a first change timing at which the target temperature changes to a target temperature to be reached by supplying the first heat transfer medium from the first adjustment apparatus to the first flow-through section, such that the first set temperature is set to a first set temperature corresponding to a post-change target temperature which is a value of the target temperature after the first change timing. The control section adjusts the amount of heat by using the adjustment section in order to control the temperature of the control target to a pre-change target temperature until the first change timing, the pre-change target temperature being a value of the target temperature before the first change timing.

According to the above-described configuration, the temperature control system includes the first adjustment apparatus, the first circulation circuit, the second adjustment apparatus, and the second circulation circuit. Therefore, the temperature of the control target can be controlled by causing the first heat transfer medium and the second heat transfer medium to flow from the first adjustment apparatus and the second adjustment apparatus to the first flow-through section and the second flow-through section, respectively, and supplying heat from the first flow-through section and the second flow-through section to the control target.

On the basis of the relation between lapse of time and the target temperature stored in the memory section, the control section sets the first set temperature, at the point in time which precedes, by the predetermined time, the first change timing at which the target temperature changes to a target temperature to be reached by supplying the first heat transfer medium from the first adjustment apparatus to the first flow-through section, such that the first set temperature is set to a first set temperature corresponding to the post-change target temperature. Therefore, by the first change timing, the first adjustment apparatus can store in the first tank the first heat transfer medium adjusted to the first set temperature corresponding to the post-change target temperature. Accordingly, after the target temperature has changed, the first adjustment apparatus can supply from the first tank the first heat transfer medium whose temperature has been adjusted beforehand, thereby enhancing the followability of the temperature of the control target to the target temperature. The only action required is to set the first set temperature to a first set temperature corresponding to the post-change target temperature at the point in time which precedes the first change timing by the predetermined time, and maintaining the drive state of the first adjustment apparatus at a high level at all times is unnecessary. Therefore, the energy consumption of the first adjustment apparatus can be reduced.

In the case where the first set temperature is set to a first set temperature corresponding to the post-change target temperature at the point in time which precedes the first change timing by the predetermined time, the temperature of the first heat transfer medium supplied from the first adjustment apparatus to the first flow-through section changes from the temperature of the first heat transfer medium before the first set temperature has been changed. In view of this, in order to control the temperature of the control target to the pre-change target temperature until the first change timing, the control section adjusts the amount of heat supplied from the first flow-through section to the control target by using the adjustment section. In addition, the control section adjusts the amount of heat supplied from the second flow-through section to the control target by using the adjustment section. Accordingly, even in the case where it is difficult to control the temperature of the control target to the target temperature by merely adjusting the amount of heat supplied from the first flow-through section to the control target by using the adjustment section, it is possible to prevent deviation of the temperature of the control target from the target temperature.

In a seventh means, during an assist period starting at the first change timing, the control section sets the second set temperature to a second set temperature corresponding to the post-change target temperature, and allows supply of the second heat transfer medium from the second adjustment apparatus to the second flow-through section. By virtue of such a configuration, when the first heat transfer medium is supplied from the first adjustment apparatus to the first flow-through section so as to control the temperature of the control target to the post-change target temperature, the temperature control can be assisted by supplying the second heat transfer medium from the second adjustment apparatus to the second flow-through section. Therefore, the followability of the temperature of the control target to the target temperature can be enhanced further.

In the case where the control section sets the first set temperature, at the point in time which precedes, by the predetermined time, the first change timing at which the target temperature changes to a target temperature to be reached by supplying the first heat transfer medium to the first flow-through section, such that the first set temperature is set to the first set temperature corresponding to the post-change target temperature, more time (the predetermined time) may be required to store in the first tank the first heat transfer medium whose temperature has been adjusted beforehand, while controlling the temperature of the control target to the target temperature.

In view of the above, in an eighth means, during a period between the point in time which precedes the first change timing by the predetermined time and the first change timing, the control section sets the second set temperature to a second set temperature corresponding to the pre-change target temperature, and allows supply of the second heat transfer medium from the second adjustment apparatus to the second flow-through section. By virtue of such a configuration, in the case where the first set temperature is set to a first set temperature corresponding to the post-change target temperature and the temperature of the control target is controlled to the pre-change target temperature by supplying the first heat transfer medium from the first adjustment apparatus to the first flow-through section, the temperature control can be assisted by supplying the second heat transfer medium from the second adjustment apparatus to the second flow-through section. Therefore, it is possible to prevent the above-described predetermined time from becoming longer.

In a ninth means, a common heat transfer medium is used in common as the first heat transfer medium and the second heat transfer medium, and a common flow-through section (i.e., common flow-through path) is used in common as the first flow-through section and the second flow-through section. The adjustment section includes a second distribution valve which changes the ratio between the common heat transfer medium flowing from the common flow-through section to the first adjustment apparatus and the common heat transfer medium flowing from the common flow-through section to the second adjustment apparatus.

According to the above-described configuration, the second distribution valve changes the ratio between the common heat transfer medium flowing from the common flow-through section to the first adjustment apparatus and the common heat transfer medium flowing from the common flow-through section to the second adjustment apparatus. Namely, the second distribution valve changes the ratio between the common heat transfer medium flowing from the first adjustment apparatus to the common flow-through section and the common heat transfer medium flowing from the second adjustment apparatus to the common flow-through section. Therefore, the ratio between the amount of heat supplied from the first adjustment apparatus to the common flow-through section and the amount of heat supplied from the second adjustment apparatus to the common flow-through section can be changed by the second distribution valve. Accordingly, the temperature of the control target can be controlled to the target temperature by changing the amount of heat supplied to the common flow-through section by using the second distribution valve. Moreover, even in the case where the first set temperature is set to a first set temperature corresponding to the post-change target temperature at the point in time which precedes the first change timing by the predetermined time, deviation of the temperature of the control target from the target temperature can be prevented by changing the amount of heat supplied to the common flow-through section by using the second distribution valve.

In a tenth means, a common heat transfer medium is used in common as the first heat transfer medium and the second heat transfer medium, and a common flow-through section is used in common as the first flow-through section and the second flow-through section. The adjustment section includes a third distribution valve which changes the ratio among the common heat transfer medium flowing from the common flow-through section to the first adjustment apparatus, the common heat transfer medium flowing out of the common flow-through section and returning to the common flow-through section without flowing through the first adjustment apparatus and the second adjustment apparatus, and the common heat transfer medium flowing from the common flow-through section to the second adjustment apparatus.

According to the above-described configuration, the temperature control system includes the third distribution valve which changes the ratio among the common heat transfer medium flowing from the common flow-through section to the first adjustment apparatus, the common heat transfer medium flowing out of the common flow-through section and returning to the common flow-through section without flowing through the first adjustment apparatus and the second adjustment apparatus, and the common heat transfer medium flowing from the common flow-through section to the second adjustment apparatus. Namely, the third distribution valve changes the ratio among the common heat transfer medium flowing from the first adjustment apparatus to the common flow-through section, the common heat transfer medium flowing out of the common flow-through section and returning to the common flow-through section without flowing through the first adjustment apparatus and the second adjustment apparatus, and the common heat transfer medium flowing from the second adjustment apparatus to the common flow-through section. Therefore, the ratio among the amount of heat that the common flow-through section receives from the first adjustment apparatus, the amount of heat returned to the common flow-through section, and the amount of heat that the common flow-through section receives from the second adjustment apparatus can be changed by the third distribution valve. Accordingly, the temperature of the control target can be controlled to the target temperature by changing the amount of heat supplied to the common flow-through section by using the third distribution valve. Moreover, even in the case where the first set temperature is set to a first set temperature corresponding to the post-change target temperature at the point in time which precedes the first change timing by the predetermined time, deviation of the temperature of the control target from the target temperature can be prevented by changing the amount of heat supplied to the common flow-through section by using the third distribution valve. In addition, it is possible to realize a state in which the common heat transfer medium flowing out of the common flow-through section is returned as it is to the common flow-through section without allowing the common heat transfer medium to flow from the common flow-through section to the first adjustment apparatus and the second adjustment apparatus.

In an eleventh means, the second circulation circuit is independent of the first circulation circuit, and the temperature control system further comprises a third circulation circuit which is independent of the first circulation circuit and the second circulation circuit and through which a third heat transfer medium whose usable temperature range is wider than usable temperature ranges of the first heat transfer medium and the second heat transfer medium circulates.

The third circulation circuit includes a third flow-through section (i.e., third flow-through path) through which the third heat transfer medium flows and which exchanges heat with the first flow-through section, and a fourth flow-through (i.e., fourth flow-through path) section through which the third heat transfer medium flows and which exchanges heat with the second flow-through section. The third circulation circuit includes no tank for storing the third heat transfer medium.

The third heat transfer medium flows from the third flow-through section and the fourth flow-through section to a heat exchange section which exchanges heat with the control target, and returns to the third flow-through section and the fourth flow-through section.

The adjustment section includes a fourth distribution valve which changes the ratio between the third heat transfer medium flowing from the heat exchange section to the third flow-through section and the third heat transfer medium flowing from the heat exchange section to the fourth flow-through section.

According to the above-described configuration, the third circulation circuit is independent of the first circulation circuit and the second circulation circuit, and the third heat transfer medium whose usable temperature range is wider than that of the first heat transfer medium circulates through the third circulation circuit. Therefore, the third heat transfer medium, which may be expensive, is caused to circulate only through the third circulation circuit, whereby the amount of the third heat transfer medium to be used can be reduced. Additionally, the third circulation circuit does not include a tank for storing the third heat transfer medium. Therefore, the amount of the third heat transfer medium circulating through the third circulation circuit can be reduced further.

The third circulation circuit includes the third flow-through section through which the third heat transfer medium flows and which exchanges heat with the first flow-through section, and the fourth flow-through section through which the third heat transfer medium flows and which exchanges heat with the second flow-through section. Therefore, the thermal energy supplied to the first flow-through section can be supplied to the third flow-through section through heat exchange between the first flow-through section and the third flow-through section. Similarly, the thermal energy supplied to the second flow-through section can be supplied to the fourth flow-through section through heat exchange between the second flow-through section and the fourth flow-through section. The third circulation circuit causes the third heat transfer medium to flow from the third flow-through section and the fourth flow-through section to the heat exchange section, which exchanges heat with the control target, and return to the third flow-through section and the fourth flow-through section. Therefore, via the third heat transfer medium, thermal energy can be supplied from the third flow-through section and the fourth flow-through section to the heat exchange section, which exchanges heat with the control target.

The fourth distribution valve changes the ratio between the third heat transfer medium flowing from the heat exchange section to the third flow-through section and the third heat transfer medium flowing from the heat exchange section to the fourth flow-through section. Therefore, the ratio between the amount of heat supplied from the third flow-through section to the heat exchange section and the amount of heat supplied from the fourth flow-through section to the heat exchange section can be changed by the fourth distribution valve. Accordingly, the temperature of the control target can be controlled to the target temperature by changing the amount of heat supplied to the heat exchange section by using the fourth distribution valve. As described above, the amount of the third heat transfer medium circulating through the third circulation circuit can be reduced. Accordingly, the temperature of the third heat transfer medium can be changed quickly, whereby responsiveness in controlling the temperature of the control target can be enhanced. Moreover, even in the case where the first set temperature is set to a first set temperature corresponding to the post-change target temperature at the point in time which precedes the first change timing by the predetermined time, deviation of the temperature of the control target from the target temperature can be prevented by changing the amount of heat supplied to the heat exchange section by using the fourth distribution valve.

In a twelfth means, the second circulation circuit is independent of the first circulation circuit, and the temperature control system further comprises a third circulation circuit which is independent of the first circulation circuit and the second circulation circuit and through which a third heat transfer medium whose usable temperature range is wider than usable temperature ranges of the first heat transfer medium and the second heat transfer medium circulates.

The third circulation circuit includes a third flow-through section through which the third heat transfer medium flows and which exchanges heat with the first flow-through section, and a fourth flow-through section through which the third heat transfer medium flows and which exchanges heat with the second flow-through section. The third circulation circuit includes no tank for storing the third heat transfer medium.

The third heat transfer medium flows from the third flow-through section and the fourth flow-through section to a heat exchange section which exchanges heat with the control target, and returns to the third flow-through section and the fourth flow-through section.

The adjustment section includes a fifth distribution valve which changes the ratio among the third heat transfer medium flowing from the heat exchange section to the third flow-through section, the third heat transfer medium flowing out of the heat exchange section and returning to the heat exchange section without flowing through the third flow-through section and the fourth flow-through section, and the third heat transfer medium flowing from the heat exchange section to the fourth flow-through section.

According to the above-described configuration, the fifth distribution valve changes the ratio among the third heat transfer medium flowing from the heat exchange section to the third flow-through section, the third heat transfer medium flowing out of the heat exchange section and returning to the heat exchange section without flowing through the third flow-through section and the fourth flow-through section, and the third heat transfer medium flowing from the heat exchange section to the fourth flow-through section. Therefore, the ratio among the amount of heat that the heat exchange section receives from the third flow-through section, the amount of heat returned to the heat exchange section, and the amount of heat that the heat exchange section receives from the fourth flow-through section can be changed by the fifth distribution valve. Accordingly, the temperature of the control target can be controlled to the target temperature by changing the amount of heat supplied to the heat exchange section by using the fifth distribution valve. Moreover, even in the case where the first set temperature is set to a first set temperature corresponding to the post-change target temperature at the point in time which precedes the first change timing by the predetermined time, deviation of the temperature of the control target from the target temperature can be prevented by changing the amount of heat supplied to the heat exchange section by using the fifth distribution valve. In addition, it is possible to realize a state in which the third heat transfer medium flowing out of the heat exchange section is returned as it is to the heat exchange section without allowing the third heat transfer medium to flow from the heat exchange section to the third flow-through section and the fourth flow-through section.

A thirteen means is a temperature control system for controlling the temperature of a control target to a target temperature which changes with lapse of time. The temperature control system comprises a first adjustment apparatus which includes a first tank for storing a first heat transfer medium and which adjusts the temperature of the first heat transfer medium to a first set temperature and supplies the temperature-adjusted first heat transfer medium; a first circulation circuit through which the first heat transfer medium flows from the first adjustment apparatus to a first flow-through section and returns to the first adjustment apparatus; a heater which heats the control target and can control its heat generation amount; a third circulation circuit which is independent of the first circulation circuit, through which a third heat transfer medium whose usable temperature range is wider than a usable temperature range of the first heat transfer medium circulates, and which includes a third flow-through section which exchanges heat with the first flow-through section and does not include a tank for storing the third heat transfer medium; an adjustment section which adjusts the amount of heat exchanged between the first flow-through section and the third flow-through section and the heat generation amount of the heater; a memory section in which the relation between lapse of time and the target temperature is stored beforehand; and a control section.

On the basis of the relation stored in the memory section, the control section sets the first set temperature, at a point in time which precedes, by a predetermined time, a first change timing at which the target temperature changes to a target temperature to be reached by supplying the first heat transfer medium from the first adjustment apparatus to the first flow-through section, such that the first set temperature is set to a first set temperature corresponding to a post-change target temperature which is a value of the target temperature after the first change timing. The control section adjusts the amount of heat and the heat generation amount by using the adjustment section in order to control the temperature of the control target to a pre-change target temperature until the first change timing, the pre-change target temperature being a value of the target temperature before the first change timing.

According to the above-described configuration, the third circulation circuit is independent of the first circulation circuit, and the third heat transfer medium whose usable temperature range is wider than that of the first heat transfer medium circulates through the third circulation circuit. Therefore, the third heat transfer medium, which may be expensive, is caused to circulate only through the third circulation circuit, whereby the amount of the third heat transfer medium to be used can be reduced. Additionally, the third circulation circuit does not include a tank for storing the third heat transfer medium. Therefore, the amount of the third heat transfer medium circulating through the third circulation circuit can be reduced further.

The first circulation circuit achieves an action and an effect similar to those of the circulation circuit of the first means. Since the first heat transfer medium whose usable temperature range is narrower than the usable temperature range of the third heat transfer medium is used, an inexpensive heat transfer medium can be used as the first heat transfer medium. The heater can heat the control target and can control its heat generation amount. Therefore, the control target can be heated directly without use of a heat transfer medium.

The temperature control system includes the adjustment section which adjusts the amount of heat exchanged between the first flow-through section and the third flow-through section and the heat generation amount of the heater. Therefore, the amount of heat supplied to the third flow-through section and the amount of heat supplied directly to the control target can be adjusted by using the adjustment section, whereby the temperature of the control target can be controlled to the target temperature. As described above, the amount of the third heat transfer medium circulating through the third circulation circuit can be reduced. Accordingly, the temperature of the third heat transfer medium can be changed quickly, whereby responsiveness in controlling the temperature of the control target can be enhanced. Moreover, even in the case where the set temperature is set to a set temperature corresponding to the post-change target temperature at the point in time which precedes the change timing by the predetermined time, deviation of the temperature of the control target from the target temperature can be prevented by changing the amount of heat supplied to the heat exchange section by using the adjustment section. In addition, the control section adjusts the amount of heat supplied from the heater directly to the control target by using the adjustment section. Therefore, even in the case where it is difficult to control the temperature of the control target to the target temperature by merely adjusting the amount of heat supplied from the first flow-through section to the control target by using the adjustment section, it is possible to prevent deviation of the temperature of the control target from the target temperature.

BRIEF DESCRIPTION OF THE DRAWINGS

The above and other features and advantages of the present invention will be apparent from the following description made with reference to the accompanying drawings.

DETAILED DESCRIPTION

First Embodiment

A first embodiment will now be described with reference to the drawings. The first embodiment is embodied as a temperature control system for controlling the temperature of a lower electrode (control target) of a semiconductor manufacturing apparatus.

Figure 1:
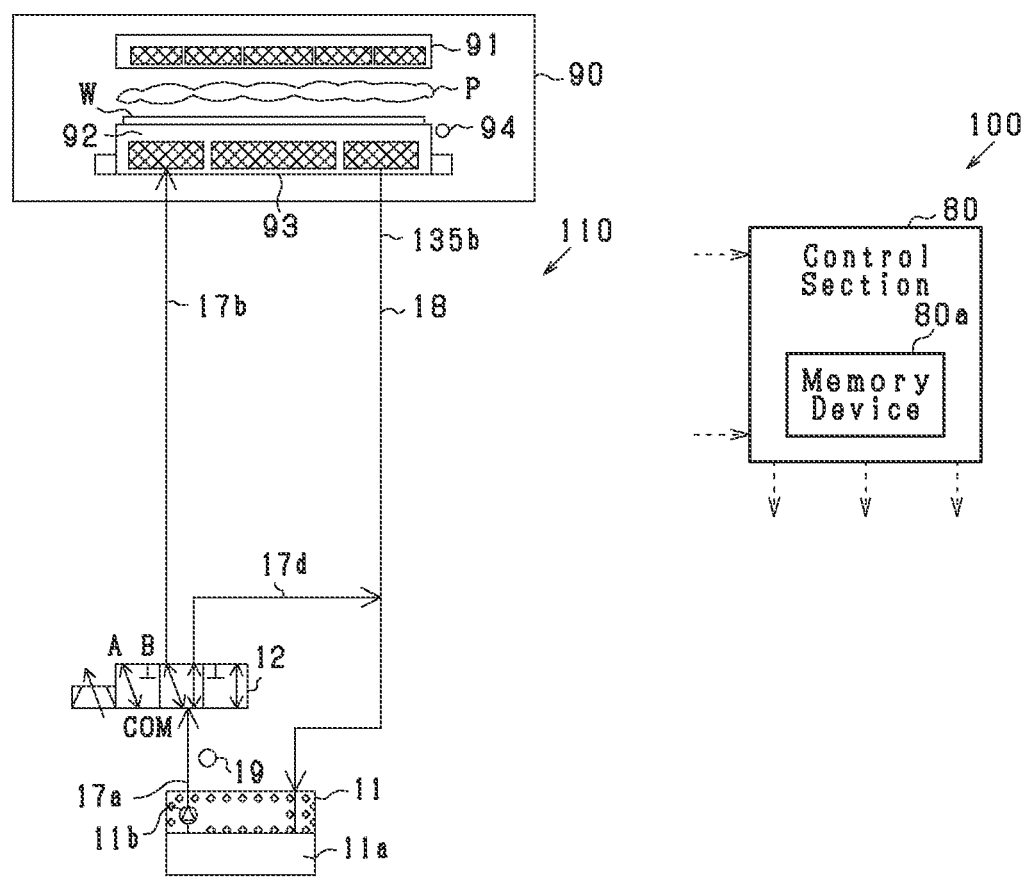
FIG. 1 is a schematic diagram of a temperature control system according to a first embodiment.

As shown in FIG. 1, a temperature control system 100 includes a first circulation circuit 110, a control section 80, etc.

The first circulation circuit 110 is a circuit through which a first heat transfer medium circulates. The first heat transfer medium (heat transfer medium) is, for example, a liquid composed of ethylene glycol (60%) and water (40%). The first heat transfer medium is relatively inexpensive. The first circulation circuit 110 includes a first chiller 11, a temperature sensor 19, a first distribution valve 12, etc.

The first chiller 11 (adjustment apparatus) includes a tank 11a, a pump 11b, etc. The first chiller 11 can adjust the temperature of the first heat transfer medium to −25° C. to 95° C. The tank 11a (first tank) stores the first heat transfer medium adjusted to a set temperature Tc. The pump 11b discharges to a flow passage 17a the first heat transfer medium stored in the tank 11a. The flow passage 17a is connected to the common port (COM) of the first distribution valve 12.

The temperature sensor 19 detects the temperature of the first heat transfer medium supplied from the first chiller 11 and outputs the detection result (detected temperature) to the control section 80.

The first distribution valve 12 (adjustment section) is a three-way valve having the common port, an A port, and a B port. A flow passage 17b is connected to the A port. A flow passage 17d is connected to the B port. The first distribution valve 12 continuously changes the ratio between the flow rate of the first heat transfer medium flowing from the flow passage 17a to the flow passage 17b and the flow rate of the first heat transfer medium flowing from the flow passage 17a to the flow passage 17d. The first distribution valve 12 continuously changes the state of flow between a state in which all (100%) of the first heat transfer medium flows from the flow passage 17a to the flow passage 17b and a state in which all (100%) of the first heat transfer medium flows from the flow passage 17a to the flow passage 17d. In the first distribution valve 12, the pressure loss of the first heat transfer medium is constant irrespective of the ratio at which the first heat transfer medium supplied from the first chiller 11 is distributed between the flow passage 17b and the flow passage 17d.

A semiconductor manufacturing apparatus 90 includes an upper electrode 91 and a lower electrode 92, and generates plasma P between the upper electrode 91 and the lower electrode 92. A workpiece W such as a wafer is placed on the lower electrode 92. A temperature sensor 94 detects the temperature of the lower electrode 92. The lower electrode 92 is integrated with a heat exchanger 93. Heat exchange is performed between the heat exchanger 93 and the lower electrode 92.

The heat exchanger 93 (flow-through section) is connected to the flow passage 17b, and the first heat transfer medium flows through the heat exchanger 93. A flow passage 18 is connected to the heat exchanger 93. The flow passage 18 connects the heat exchanger 93 and the tank 11a of the first chiller 11. The above-described flow passage 17d connects the B port of the first distribution valve 12 and the flow passage 18. Namely, the first distribution valve 12 changes the ratio between the first heat transfer medium flowing from the first chiller 11 to the heat exchanger 93 and the first heat transfer medium flowing out of the first chiller 11 and returning to the first chiller 11 without flowing through the heat exchanger 93. In the heat exchanger 93, heat exchange is performed between the first heat transfer medium and the lower electrode 92. Notably, the flow passages 17a, 17b, 17d, and 18 form a circulation circuit.

The control section 80 is a microcomputer including a CPU, a ROM, a RAM, a memory device 80a, an input/output interface, etc. The control section 80 receives the results of detections performed by the temperature sensors 19 and 94, etc. The control section 80 controls the temperature of the lower electrode 92 to a target temperature Te. The target temperature Te is changed to, for example, 90° C., 0° C., or –20° C. in accordance with a process (lapse of time) in the semiconductor manufacturing apparatus 90. Since heat flows from the plasma P into the lower electrode 92, the temperature of the lower electrode 92 may rise to about 110° C. upon generation of the plasma P. As a result of the temperature rise, the temperature of the first heat transfer medium flowing out of the heat exchanger 93 may also rise to a temperature close to 110° C.

The control section 80 controls the set temperature Tc of the first chiller 11 and the distribution ratio of the first distribution valve 12 on the basis of the target temperature Te of the lower electrode 92 and the results of detections performed by the temperature sensors 19 and 94 (i.e., the temperatures detected by the temperature sensors 19 and 94). Thus, the flow rate of the first heat transfer medium flowing through the heat exchanger 93 is adjusted; as a result, the amount of heat supplied to the heat exchanger 93 is adjusted. Namely, the first distribution valve 12 adjusts the amount of heat supplied from the heat exchanger 93 to the lower electrode 92. The control section 80 sets the set temperature Tc of the first chiller 11 to a set temperature Tc corresponding to the target temperature Te and feedback-controls the distribution ratio of the first distribution valve 12 such that the temperature of the lower electrode 92 becomes equal to the target temperature Te.

Figure 2:
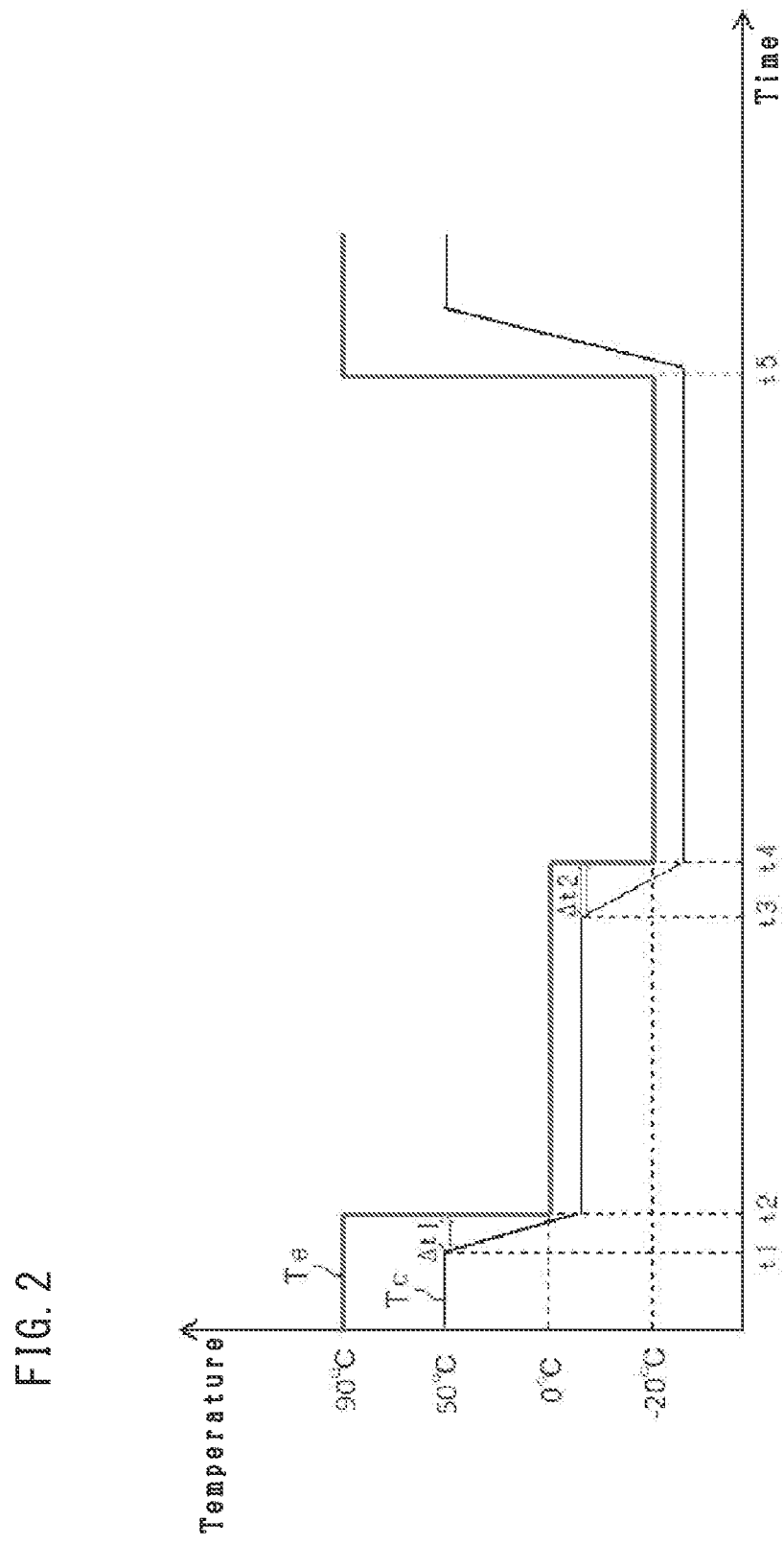
FIG. 2 is a time chart showing changes in the target temperature of a lower electrode and the set temperature of a first chiller.

FIG. 2 is a time chart showing changes in the target temperature Te of the lower electrode 92 and the set temperature Tc of the first chiller 11. As shown in FIG. 2, the target temperature Te of the lower electrode 92 periodically changes to 90° C., to 0° C., and to –20° C. with the progress of the process in the semiconductor manufacturing apparatus 90 (with lapse of time). The relation between lapse of time and the target temperature Te is stored in the memory device 80a (memory section) of the control section 80 beforehand. For example, the memory device 80a stores the target temperature Te which changes with time such that the target temperature Te is 90° C. until time t2, changes to 0° C. at time t2, is 0° C. until time t4, changes to –20° C. at time t4, is –20° C. until time t5, and changes to 90° C. at time t5.

In response to each change in the target temperature Te, the control section 80 sets the set temperature Tc of the first chiller 11 to a set temperature Tc corresponding to the target temperature Te. For example, when the target temperature Te is 90° C., the control section 80 sets the set temperature Tc to 50° C.; when the target temperature Te is 0° C., the control section 80 sets the set temperature Tc to –5° C.; and when the target temperature Te is –20° C., the control section 80 sets the set temperature Tc to –25° C. The control section 80 feedback-controls the output of the first chiller 11 such that the temperature T1 of the first heat transfer medium detected by the temperature sensor 19 becomes equal to the set temperature Tc. Also, the control section 80 feedback-controls the distribution ratio of the first distribution valve 12 such that the temperature T3 of the lower electrode 92 detected by the temperature sensor 94 becomes equal to the target temperature Te.

Further, the control section 80 sets the set temperature Tc on the basis of the above-described relation stored in the memory device 80a. Specifically, at a point in time which precedes, by a predetermined time Δt, a change timing at which the target temperature Te changes from a target temperature Te1 to a target temperature Te2, the control section 80 sets the set temperature Tc to a set temperature Tc2 corresponding to a post-change target temperature Te2 which is a value of the target temperature Te after the change timing. Subsequently, the control section 80 controls the first distribution valve 12 so as to adjust the ratio of distribution of the first heat transfer medium between the flow passage 17b and the flow passage 17d such that the temperature of the lower electrode 92 is controlled to a pre-change target temperature Te1 until the change timing. The pre-change target temperature Te1 is a value of the target temperature Te before the change timing. As a result, the first heat transfer medium adjusted to the set temperature Tc2 corresponding to the post-change target temperature Te2 is stored in the tank 11a by the change timing.

For example, at time t1 which precedes time t2 by the predetermined time Δt1, the control section 80 sets the set temperature Tc such that the set temperature Tc gradually changes to a set temperature Tc (=–5° C.) corresponding to the post-change target temperature Te2 (=0° C.). Also, in order to control the temperature of the lower electrode 92 to the pre-change target temperature Te1 (=90° C.) until time t2, the control section 80 controls the first distribution valve 12 to decrease the ratio of distribution of the first heat transfer medium to the flow passage 17b and increase the ratio of distribution of the first heat transfer medium to the flow passage 17d. Namely, the control section 80 reduces the amount of the first heat transfer medium flowing to the flow passage 17b in order to prevent the temperature of the lower electrode 92 from dropping from the target temperature Te1 (=90° C.) even when the first heat transfer medium whose temperature is lower than the set temperature Tc1 (=50° C.) corresponding to the target temperature Te1 (=90° C.) is supplied from the first chiller 11. Notably, instead of gradually changing the set temperature Tc at time t1, the set temperature Tc may be instantaneously set to the set temperature Tc2 (=−5° C.) corresponding to the post-change target temperature Te2 (=0° C.) Similarly, at time t3 which precedes time t4 by a predetermined time Δt2, the control section 80 sets the set temperature Tc such that the set temperature Tc gradually changes to a set temperature Tc3 (=−25° C.) corresponding to a post-change target temperature Te3 (=−20° C.) (or the control section 80 instantaneously sets the set temperature Tc to the set temperature Tc3 (=−25° C.)). Also, in order to control the temperature of the lower electrode 92 to the pre-change target temperature Te2 (=0° C.) until time t4, the control section 80 controls the first distribution valve 12 to decrease the ratio of distribution of the first heat transfer medium to the flow passage 17b and increase the ratio of distribution of the first heat transfer medium to the flow passage 17d.

The amount of heat which the first chiller 11 must store in the tank 11a beforehand by the change timing at which the target temperature Te changes correlates with the post-change target temperature Te2 of the lower electrode 92, the current temperature of the first heat transfer medium, and the heat capacity C from the first chiller 11 to the lower electrode 92. The set temperature Tc of the first chiller 11 for controlling the temperature of the lower electrode 92 to the target temperature Te2 is the set temperature Tc2 corresponding to the target temperature Te2. Also, the time which the first chiller 11 needs to store a required amount of heat in the tank 11a correlates with the output (operating state) of the first chiller 11.

In view of the forgoing, the control section 80 sets the above-described predetermined time Δt on the basis of the set temperature Tc2 corresponding to the post-change target temperature Te2, the temperature T1 of the first heat transfer medium detected by the temperature sensor 19, the heat capacity C from the first chiller 11 to the lower electrode 92, and the output q of the first chiller 11. The heat capacity C includes the heat capacities of members whose temperatures change when the temperature of the lower electrode 92 is controlled. Examples of the members include the lower electrode 92, the circulating first heat transfer medium, the heat exchanger 93, the flow passages 17a, 17b, and 18, the first distribution valve 12, and the tank 11a. During the predetermined time Δt, the first chiller 11 is operated such that the output q of the first chiller 11 becomes the maximum output qm (q=qm). Specifically, the control section 80 sets the predetermined time Δt in accordance with an equation of Δt=C×(T−Tc2)/q. Notably, in the case where the first chiller 11 has already operated to produce an output ql, the difference (qm−ql) between the maximum output qm and the output ql may be used as the output q.

The present embodiment having been described in detail above has the following advantages.

When the target temperature Te of the lower electrode 92 changes with time, the temperature of the lower electrode 92 must be changed quickly to follow the target temperature Te. In view of this, at a point in time which precedes, by the predetermined time Δt, the change timing at which the target temperature Te changes, the control section 80 sets the set temperature Tc to a set temperature Tc corresponding to the post-change target temperature Te on the basis of the relation between lapse of time and the target temperature Te, which relation is stored in the memory device 80a. Therefore, by the change timing, the first chiller 11 can store in the tank 11a the first heat transfer medium adjusted to the set temperature Tc corresponding to the post-change target temperature Te. Accordingly, after the target temperature Te has changed, the first chiller 11 can supply from the tank 11a the first heat transfer medium whose temperature has been adjusted beforehand, whereby the followability of the temperature of the lower electrode 92 to the target temperature Te can be enhanced. The only action required is to set the set temperature Tc to a set temperature Tc corresponding to the post-change target temperature Te, at the point in time which precedes the change timing by the predetermined time Δt, and maintaining the drive state of the first chiller 11 at a high level at all times is unnecessary. Therefore, the energy consumption of the first chiller 11 can be reduced.

In the case where the set temperature Tc is set to a set temperature Tc corresponding to the post-change target temperature Te at the point in time which precedes the change timing by the predetermined time Δt, the temperature of the first heat transfer medium supplied from the first chiller 11 to the heat exchanger 93 changes from the temperature of the first heat transfer medium before the set temperature Tc has been changed. In view of this, in order to control the temperature of the lower electrode 92 to the pre-change target temperature Te until the change timing, the control section 80 adjusts the amount of heat supplied from the first chiller 11 to the heat exchanger 93, and thus adjusts the amount of heat supplied from the heat exchanger 93 to the lower electrode 92, by using the first distribution valve 12. Accordingly, even in the case where the set temperature Tc is set to a set temperature Tc corresponding to the post-change target temperature Te at the point in time which precedes the change timing by the predetermined time Δt, it is possible to prevent deviation of the temperature of the lower electrode 92 from the target temperature Te.

The control section 80 sets the predetermined time Δt on the basis of the post-change target temperature Te of the lower electrode 92 (the set temperature Tc corresponding to the target temperature Te), the temperature T1 of the first heat transfer medium detected by the temperature sensor 19, the heat capacity C from the first chiller 11 to the lower electrode 92, and the operating state (output q) of the first chiller 11. Accordingly, the predetermined time Δt can be set appropriately. Thus, it is possible to reduce the energy consumption of the first chiller 11 while enhancing the followability of the temperature of the lower electrode 92 to the target temperature Te.

The control section 80 sets the predetermined time Δt on the assumption that the first chiller 11 is operated to produce a maximum output (qm), and the first chiller 11 is operated to produce the maximum output until the change timing since the point in time which precedes the change timing by the predetermined time Δt. By virtue of such a configuration, the predetermined time Δt which the first chiller 11 requires to store a required amount of heat in the tank 11a beforehand can be made the shortest, and the period of time during which ordinary control is performed; i.e., the set temperature Tc of the first chiller 11 is set to a set temperature Tc corresponding to the current target temperature Te, can be made longer. Accordingly, the accuracy in controlling the temperature of the lower electrode 92 to the target temperature Te can be increased.

The first distribution valve 12 changes the ratio between the first heat transfer medium flowing from the first chiller 11 to the heat exchanger 93 and the first heat transfer medium flowing out of the first chiller 11 and returning to the first chiller 11 without flowing through the heat exchanger 93. Therefore, the ratio between the amount of heat supplied from the first chiller 11 to the heat exchanger 93 and the amount of heat returned to the first chiller 11 can be changed by the first distribution valve 12. Accordingly, the temperature of the lower electrode 92 can be controlled to the target temperature Te by changing the amount of heat supplied to the heat exchanger 93 by using the first distribution valve 12. Moreover, even in the case where the set temperature Tc is set to a set temperature Tc corresponding to the post-change target temperature Te at the point in time which precedes the change timing by the predetermined time Δt, deviation of the temperature of the lower electrode 92 from the target temperature Te can be prevented by changing the amount of heat supplied to the heat exchanger 93 by using the first distribution valve 12.

Notably, the predetermined time Δt may be set as follows. It is assumed that, during the predetermined time Δt, the first chiller 11 is operated to produce a maximum efficiency output qe at which its operation efficiency becomes the maximum. In such a case, the predetermined time Δt is set in accordance with the equation of $\Delta t = C \times (T1-Tc2)/q$ where q=qe. Namely, the control section 80 may set the predetermined time Δt under the assumption that the first chiller 11 is operated such that its operation efficiency becomes the maximum, and operate the first chiller 11 such that its operation efficiency becomes the maximum, until the change timing since the point in time which precedes the change timing by the predetermined time Δt. By virtue of such a configuration, when the first chiller 11 stores a required amount of heat in the tank 11a beforehand, the first chiller 11 can be operated such that its operation efficiency becomes the maximum, whereby the energy consumption of the first chiller 11 can be reduced. Notably, in the case where the first chiller 11 has already operated to produce an output ql, the difference (qe−ql) between the maximum efficiency output qe and the output ql may be used as the output q.

Second Embodiment

A second embodiment will now be described. In the following description, the difference between the second embodiment and the first embodiment will be mainly described. Notably, portions identical with those of the first embodiment are denoted by the same reference numerals, and their description will not be repeated.

Figure 3:
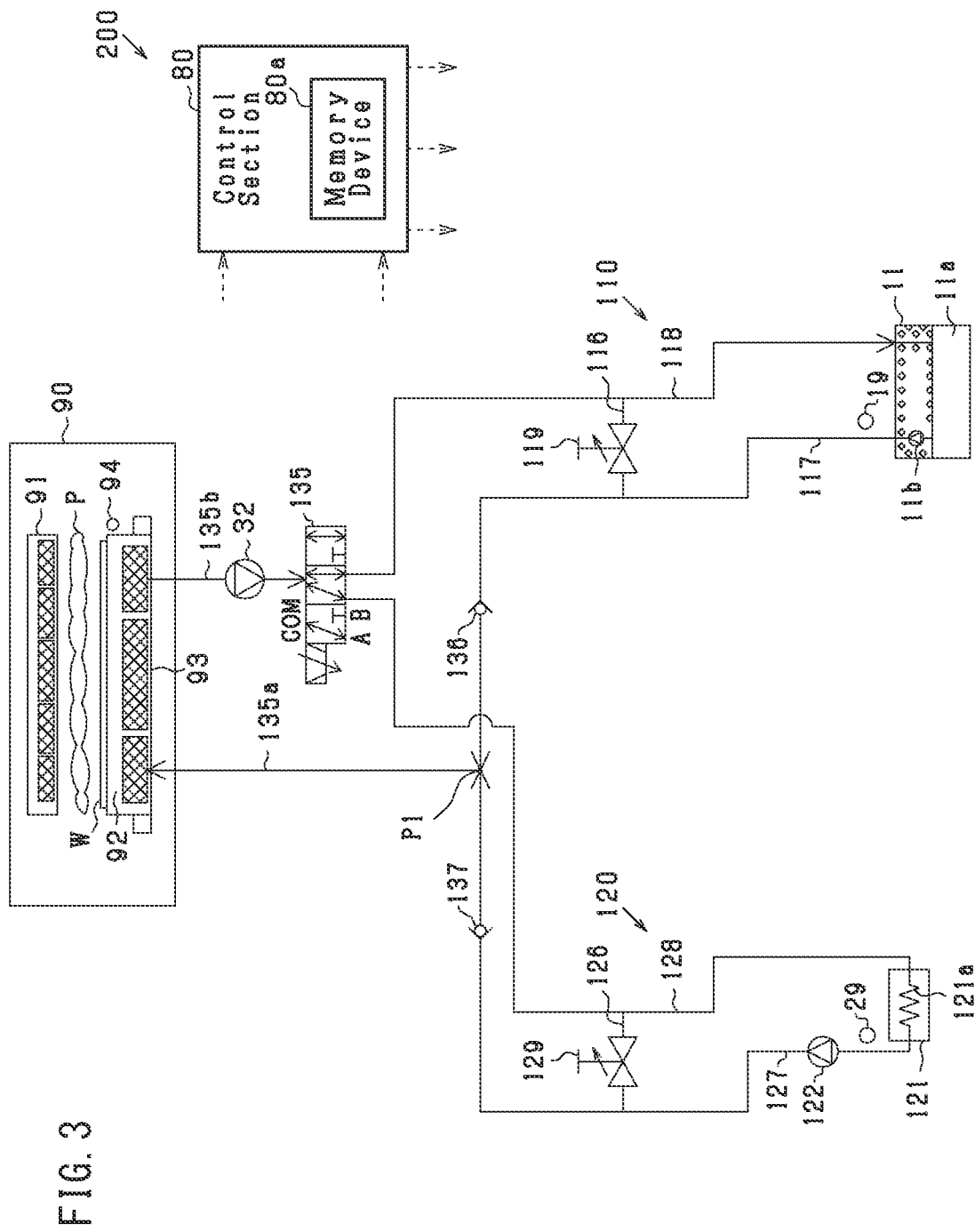
FIG. 3 is a schematic diagram of a temperature control system according to a second embodiment.

As shown in FIG. 3, a temperature control system 200 includes a first circulation circuit 110, a second circulation circuit 120, the control section 80, etc. The first circulation circuit 110 is a circuit through which the above-described first heat transfer medium circulates. The second circulation circuit 120 is a circuit through which a second heat transfer medium circulates. The second heat transfer medium is the same liquid as the first heat transfer medium. Namely, the first circulation circuit 110 and the second circulation circuit 120 are circuits through which the above-described first heat transfer medium (common heat transfer medium) used in common circulates.

The first circulation circuit 110 includes the first chiller 11 (first adjustment apparatus), a needle valve 119, etc. The first circulation circuit 110 does not include the above-described first distribution valve 12.

The pump 11b discharges to the flow passage 117 the first heat transfer medium stored in the tank 11a. A first check valve 136 is provided in the flow passage 117. The first check valve 136 permits the first heat transfer medium to flow from the first chiller 11 to a merging point P1 and prohibits the first heat transfer medium from flowing from the merging point P1 to the first chiller 11. The tank 11a of the first chiller 11 and the B port of a second distribution valve 135 are connected to each other by a flow passage 118. The second distribution valve 135 (adjustment section) is a three-way valve having a common port, an A port, and the B port. The first chiller 11 adjusts the temperature of the first heat transfer medium to a set temperature Tc (first set temperature) and supplies the temperature-adjusted first heat transfer medium. The flow passages 117 and 118 are connected to each other by a flow passage 116. The needle valve 119 is provided in the flow passage 116.

The second circulation circuit 120 (circulation circuit) includes a heater 121, a temperature sensor 29, a needle valve 129, etc. The second circulation circuit 120 does not include the above-described first distribution valve 12. The heater 121 (second adjustment apparatus) is a heater which can control the amount of heat generated. The heater 121 includes a heating wire heater, a ceramic heater, or the like (not shown) and a flow passage 121a through which the first heat transfer medium flows, and heats the first heat transfer medium flowing through the flow passage 121a. The heater 121 adjusts the temperature of the second heat transfer medium (i.e., first heat transfer medium) to a set temperature Th (second set temperature) and supplies the temperature-adjusted second heat transfer medium. The heating state of the heater 121 is controlled by the control section 80 on the basis of the temperature detected by the temperature sensor 29.

The flow passage 121a of the heater 121 and the above-described merging point P1 are connected to each other by a flow passage 127. A pump 122 and a second check valve 137 are provided in the flow passage 127. The pump 122 receives the first heat transfer medium from the flow passage 121a of the heater 121 and discharges the first heat transfer medium to the merging point P1 through the flow passage 127. The second check valve 137 permits the first heat transfer medium to flow from the pump 122 to the merging point P1 and prohibits the first heat transfer medium from flowing from the merging point P1 to the pump 122. The flow passage 121a of the heater 121 and the A port of the second distribution valve 135 are connected to each other by a flow passage 128. The flow passage 127 and the flow passage 128 are connected to each other by a flow passage 126. The needle valve 129 is provided in the flow passage 126.

The flow passage 117 and the flow passage 127 are connected to a flow passage 135a at the merging point P1. The flow passage 135a is connected to the inlet port of the heat exchanger 93. A flow passage 135b is connected to the outlet port of the heat exchanger 93. A pump 32 is provided in the flow passage 135b. The flow passage 135b is connected to the common port of the second distribution valve 135.

The second distribution valve 135 (adjustment section) continuously changes the ratio between the flow rate of the first heat transfer medium flowing from the flow passage 135b to the flow passage 118 and the flow rate of the first heat transfer medium flowing from the flow passage 135b to the flow passage 128. Namely, the second distribution valve 135 changes the ratio between the first heat transfer medium flowing from the heat exchanger 93 (first flow-through section, common flow-through section) to the first chiller 11 and the first heat transfer medium flowing from the heat exchanger 93 (second flow-through section, common flow-through section) to the heater 121. The second distribution valve 135 continuously changes the state of flow between a state in which all (100%) of the first heat transfer medium flows from the flow passage 135b to the flow passage 118 and a state in which all (100%) of the first heat transfer medium flows from the flow passage 135*b* to the flow passage 128. In the state in which all (100%) of the first heat transfer medium flows from the flow passage 135*b* to the flow passage 118, the needle valve 129 adjusts the amount of the first heat transfer medium circulating from the flow passage 127 to the flow passage 128. In the state in which all (100%) of the first heat transfer medium flows from the flow passage 135*b* to the flow passage 128, the needle valve 119 adjusts the amount of the first heat transfer medium circulating from the flow passage 117 to the flow passage 118. In the second distribution valve 135, the pressure loss of the first heat transfer medium is constant irrespective of the ratio at which the first heat transfer medium supplied from the pump 32 is distributed between the first chiller 11 and the heater 121. Notably, the second distribution valve 135 may continuously change the state of flow between a state in which a portion (less than 100%, for example, 90%) of the first heat transfer medium flows from the flow passage 135*b* to the flow passage 118 and a state in which a portion (less than 100%, for example, 90%) of the first heat transfer medium flows from the flow passage 135*b* to the flow passage 128. In such a case, the flow passages 116 and 126 and the needle valves 119 and 129 may be omitted. Also, the pump 32 may be omitted.

Since the load of the pump 32 does not change irrespective of the distribution ratio of the second distribution valve 135, the pump 32 is driven in a constant drive state. As a result, the pump 32 circulates the first heat transfer medium through the first circulation circuit 110 and the second circulation circuit 120. Notably, the first circulation circuit 110 and the second circulation circuit 120 share the flow passages 135*a* and 135*b*, the pump 32, and the second distribution valve 135.

The control section 80 controls the temperature of the lower electrode 92 to the target temperature Te. The control section 80 controls the distribution ratio of the second distribution valve 135 on the basis of the target temperature Te of the lower electrode 92 and the temperature detected by the temperature sensor 94. Thus, the flow rate of the first heat transfer medium flowing to the chiller 11 is adjusted; as a result, the amount of heat supplied from the first chiller 11 to the heat exchanger 93 is adjusted. Also, the flow rate of the first heat transfer medium flowing to the heater 121 is adjusted; as a result, the amount of heat supplied from the heater 121 to the heat exchanger 93 is adjusted.

In the same manner as the manner shown in FIG. 2, in response to each change in the target temperature Te, the control section 80 sets the set temperature Tc of the first chiller 11 to a set temperature Tc corresponding to the target temperature Te. Subsequently, the control section 80 feedback-controls the output of the first chiller 11 such that the temperature T1 of the first heat transfer medium detected by the temperature sensor 19 becomes equal to the set temperature Tc. Also, the control section 80 feedback-controls the distribution ratio of the second distribution valve 135 such that the temperature T3 of the lower electrode 92 detected by the temperature sensor 94 becomes equal to the target temperature Te.

Further, the control section 80 sets the set temperature Tc and controls the second distribution valve 135 on the basis of the above-described relation stored in the memory device 80*a*. Specifically, at the point in time which precedes, by the predetermined time Δt, the first change timing at which the target temperature Te changes from the target temperature Te1 to the target temperature Te2, the control section 80 sets the set temperature Tc to a set temperature Tc2 corresponding to the post-change target temperature Te2. Subsequently, in order to control the temperature of the lower electrode 92 to the pre-change target temperature Te1 until the first change timing, the control section 80 controls the second distribution valve 135 so as to adjust the ratio of distribution of the first heat transfer medium between the flow passage 118 and the flow passage 128. In addition, the control section 80 controls the heat generation amount of the heater 121.

For example, at time t1 which precedes time t2 by a predetermined time Δt1, the control section 80 sets the set temperature Tc such that the set temperature Tc gradually changes to a set temperature Tc (=−5° C.) corresponding to the post-change target temperature Te2 (=0° C.) Also, in order to control the temperature of the lower electrode 92 to the pre-change target temperature Te1 (=90° C.) until time t2, the control section 80 controls the second distribution valve 135 to decrease the ratio of distribution of the first heat transfer medium to the flow passage 118 and increase the ratio of distribution of the first heat transfer medium to the flow passage 128. At that time, the first heat transfer medium heated by the heater 121 is supplied to the flow passages 127 and 135*a*, and thus supplied to the heat exchanger 93.

Notably, during the predetermined time Δt1, the heater 121 may be stopped (heating of the first heat transfer medium may be stopped). In such a case, by the second distribution valve 135, the ratio of distribution of the first heat transfer medium to the flow passage 118 is decreased, and the ratio of distribution of the first heat transfer medium to the flow passage 128 is increased. Also, in the state in which the first heat transfer medium flows thorough the flow passages 127, 135*a*, and 128, the first heat transfer medium may be heated by the heater 121 without changing the distribution ratio of the second distribution valve 135. By these operations as well, during the period from time t1 to time t2, the temperature of the lower electrode 92 can be controlled to the pre-change target temperature Te1 (=90° C.)

At time t5, the control section 80 sets the set temperature Tc such that the set temperature Tc gradually changes to a set temperature Tc (=50° C.) corresponding to a post-change target temperature Te4 (=90° C.). Also, the control section 80 controls the second distribution valve 135 to decrease the ratio of distribution of the first heat transfer medium to the flow passage 118 and increase the ratio of distribution of the first heat transfer medium to the flow passage 128. At that time, the control section 80 supplies the first heat transfer medium, adjusted to the set temperature Th by the heater 121, to the flow passages 127 and 135*a*. As a result, the first heat transfer medium adjusted to the set temperature Th is supplied to the heat exchanger 93, whereby the temperature of the lower electrode 92 is raised sharply. The set temperature Th is set on the basis of the target temperature Te of the lower electrode 92 and the temperature detected by the temperature sensor 94.

The present embodiment having been described in detail above has the following advantages. Notably, only the advantages different from those of the first embodiment will be described.

The temperature control system 200 includes the first chiller 11, the first circulation circuit 110, the heater 121, and the second circulation circuit 120. Therefore, the temperature of the lower electrode 92 can be controlled by causing the first heat transfer medium (second heat transfer medium) to flow from the first chiller 11 and the heater 121 to the heat exchanger 93 (first flow-through section, second flow-through section) and supplying heat from the heat exchanger 93 to the lower electrode 92.

The control section 80 sets the set temperature Tc on the basis of the relation between lapse of time and the target temperature Te, which relation is stored in the memory device 80a. Specifically, at a point in time which precedes, by the predetermined time Δt, the first change timing at which the target temperature Te changes to a target temperature Te (i.e., first target temperature) to be reached by supplying the first heat transfer medium from the first chiller 11 to the heat exchanger 93, the control section 80 sets the set temperature Tc to a set temperature Tc corresponding to the post-change target temperature Te. Therefore, by the first change timing, the first chiller 11 can store in the tank 11a the first heat transfer medium adjusted to the set temperature Tc corresponding to the post-change target temperature Te. Accordingly, after the target temperature Te has changed, the first chiller 11 can supply from the tank 11a the first heat transfer medium whose temperature has been adjusted beforehand, thereby enhancing the followability of the temperature of the lower electrode 92 to the target temperature Te. The only action required is to set the set temperature Tc to a set temperature Tc corresponding to the post-change target temperature Te at the point in time which precedes the first change timing by the predetermined time Δt, and maintaining the drive state of the first chiller 11 at a high level at all times is unnecessary. Therefore, the energy consumption of the first chiller 11 can be reduced.

In order to control the temperature of the lower electrode 92 to the pre-change target temperature Te until the first change timing, the control section 80 adjusts the amount of heat supplied from the first chiller 11 to the heat exchanger 93, and thus adjusts the amount of heat supplied from the heat exchanger 93 to the lower electrode 92, by using the second distribution valve 135. In addition, the control section 80 adjusts the amount of heat supplied from the heater 121 to the heat exchanger 93, and thus adjusts the amount of heat supplied from the heat exchanger 93 to the lower electrode 92, by using the second distribution valve 135. Therefore, even in the case where it is difficult to control the temperature of the lower electrode 92 to the target temperature Te by merely adjusting the amount of heat supplied from the first chiller 11 to the heat exchanger 93 by using the second distribution valve 135, it is possible to prevent deviation of the temperature of the lower electrode 92 from the target temperature Te.

The second distribution valve 135 changes the ratio between the first heat transfer medium (common heat transfer medium) flowing from the heat exchanger 93 (common flow-through section) to the first chiller 11 and the first heat transfer medium flowing from the heat exchanger 93 to the heater 121. Namely, the second distribution valve 135 changes the ratio between the first heat transfer medium flowing from the first chiller 11 to the heat exchanger 93 and the first heat transfer medium flowing from the heater 121 to the heat exchanger 93. Accordingly, the temperature of the lower electrode 92 can be controlled to the target temperature Te by changing the amount of heat supplied to the heat exchanger 93 by using the second distribution valve 135.

In the second distribution valve 135, the pressure loss of the first heat transfer medium is constant irrespective of the ratio between the first heat transfer medium flowing from the heat exchanger 93 to the first chiller 11 and the first heat transfer medium flowing from the heat exchanger 93 to the heater 121. Therefore, in the case where the first heat transfer medium is caused by the pump 32 to circulate through the first circulation circuit 110 and the second circulation circuit 120, it is unnecessary to control the drive state of the pump 32, and the pump 32 can be driven in a constant drive state.

Notably, in the second distribution valve 135, the pressure loss of the first heat transfer medium may change in accordance with the ratio between the first heat transfer medium flowing from the heat exchanger 93 to the first chiller 11 and the first heat transfer medium flowing from the heat exchanger 93 to the heater 121. In such a case, the drive state of the pump 32 is changed appropriately.

Third Embodiment

A third embodiment will now be described. In the following description, the difference between the third embodiment and the second embodiment will be mainly described. Notably, portions identical with those of the first and second embodiments are denoted by the same reference numerals, and their description will not be repeated.

Figure 4:
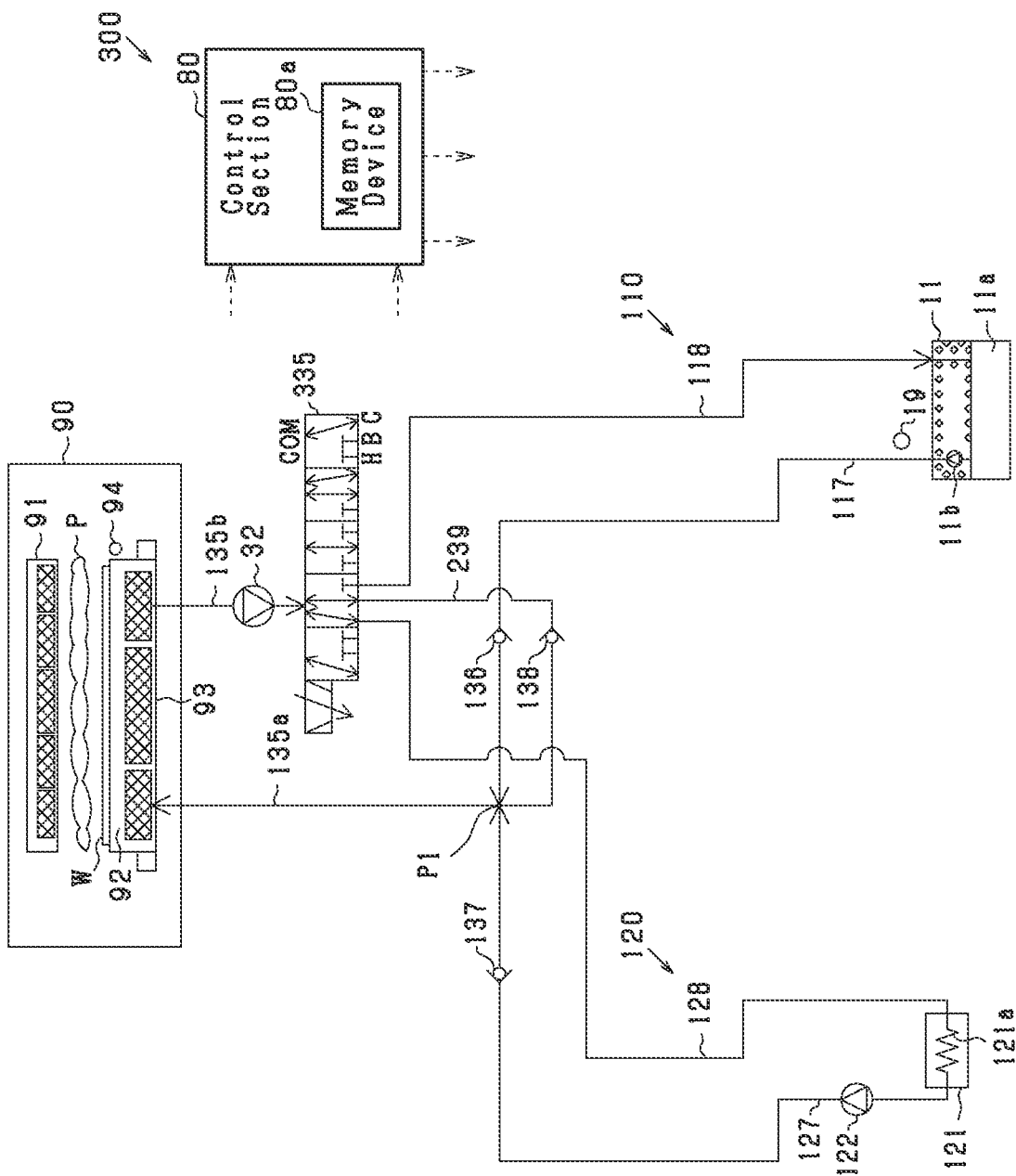
FIG. 4 is a schematic diagram of a temperature control system according to a third embodiment.

As shown in FIG. 4, a temperature control system 300 of the present embodiment is identical with the temperature control system 200 of the second embodiment except that the second distribution valve 135 is replaced with a third distribution valve 335.

The third distribution valve 335 (adjustment section) is a four-way valve having a common port, an H port, a B port, and a C port. The flow passage 118 is connected to the C port. The flow passage 118 is connected to the tank 11a of the first chiller 11. A flow passage 239 is connected to the B port. The flow passage 239 is connected to the flow passage 135a at the merging point P1. A third check valve 138 is provided in the flow passage 239. The third check valve 138 permits the first heat transfer medium to flow from the third distribution valve 335 to the merging point P1 and prohibits the first heat transfer medium from flowing from the merging point P1 to the third distribution valve 335. The flow passage 128 is connected to the H port. The flow passage 128 is connected to the flow passage 121a of the heater 121.

The third distribution valve 335 continuously changes the ratio among the flow rate of the first heat transfer medium flowing from the flow passage 135b to the flow passage 118, the flow rate of the first heat transfer medium flowing from the flow passage 135b to the flow passage 239, and the flow rate of the first heat transfer medium flowing from the flow passage 135b to the flow passage 128. Namely, the third distribution valve 335 changes the ratio among the first heat transfer medium flowing from the heat exchanger 93 to the first chiller 11, the first heat transfer medium flowing out of the heat exchanger 93 and returning to the heat exchanger 93 without flowing through the first chiller 11 and the heater 121, and the first heat transfer medium flowing from the heat exchanger 93 to the heater 121. The third distribution valve 335 continuously changes the state of flow among a state in which all (100%) of the first heat transfer medium flows from the flow passage 135b to the flow passage 118, a state in which the first heat transfer medium flows from the flow passage 135b to the flow passages 118 and 239, a state in which all (100%) of the first heat transfer medium flows from the flow passage 135b to the flow passage 239, a state in which the first heat transfer medium flows from the flow passage 135b to the flow passages 239 and 128, and a state in which all (100%) of the first heat transfer medium flows from the flow passage 135b to the flow passage 128. In the third distribution valve 335, the pressure loss of the first heat transfer medium is constant irrespective of the ratio at which the first heat transfer medium supplied from the pump 32 is distributed among the flow passages 118, 239, and 128.

Since the load of the pump 32 does not change irrespective of the distribution ratio of the third distribution valve 335, the pump 32 is driven in a constant drive state. As a result, the pump 32 circulates the first heat transfer medium through the first circulation circuit 110 and the second circulation circuit 120. The first circulation circuit 110 and the second circulation circuit 120 share the flow passages 135a and 135b, the pump 32, and the third distribution valve 335.

The control section 80 controls the temperature of the lower electrode 92 to the target temperature Te. The control section 80 controls the distribution ratio of the third distribution valve 335 on the basis of the target temperature Te of the lower electrode 92 and the temperature detected by the temperature sensor 94. Also, in the same manner as the manner shown in FIG. 2, in response to each change in the target temperature Te, the control section 80 sets the set temperature Tc of the first chiller 11 to a set temperature Tc corresponding to the target temperature Te. Also, the control section 80 controls the heat generation amount of the heater 121.

The present embodiment having been described in detail above has the following advantages. Notably, only the advantages different from those of the second embodiment will be described.

The temperature control system 300 includes the third distribution valve 335 which changes the ratio among the first heat transfer medium flowing from the heat exchanger 93 to the first chiller 11, the first heat transfer medium flowing out of the heat exchanger 93 and returning to the heat exchanger 93 without flowing through the first chiller 11 and the heater 121, and the first heat transfer medium flowing from the heat exchanger 93 to the heater 121. Namely, the third distribution valve 335 changes the ratio among the first heat transfer medium flowing from the first chiller 11 to the heat exchanger 93, the first heat transfer medium flowing out of the heat exchanger 93 and returning to the heat exchanger 93 without flowing through the first chiller 11 and the heater 121, and the first heat transfer medium flowing from the heater 121 to the heat exchanger 93. Therefore, the ratio among the amount of heat that the heat exchanger 93 receives from the first chiller 11, the amount of heat returned to the heat exchanger 93, and the amount of heat that the heat exchanger 93 receives from the heater 121 can be changed by the third distribution valve 335. Accordingly, the temperature of the lower electrode 92 can be controlled to the target temperature Te by changing the amount of heat supplied to the heat exchanger 93 by using the third distribution valve 335.

Even in the case where the set temperature Tc is set to a set temperature Tc corresponding to the post-change target temperature Te at the point in time which precedes the first change timing by the predetermined time Δt, deviation of the temperature of the lower electrode 92 from the target temperature Te can be prevented by changing the amount of heat supplied to the heat exchanger 93 by using the third distribution valve 335.

Further, it is possible to realize a state in which the first heat transfer medium flowing out of the heat exchanger 93 is returned as it is to the heat exchanger 93 without allowing the first heat transfer medium to flow from the heat exchanger 93 to the first chiller 11 and the heater 121.

Fourth Embodiment

A fourth embodiment will now be described. In the following description, the difference between the fourth embodiment and the second embodiment will be mainly described. Notably, portions identical with those of the first through third embodiments are denoted by the same reference numerals, and their description will not be repeated.

Figure 5:
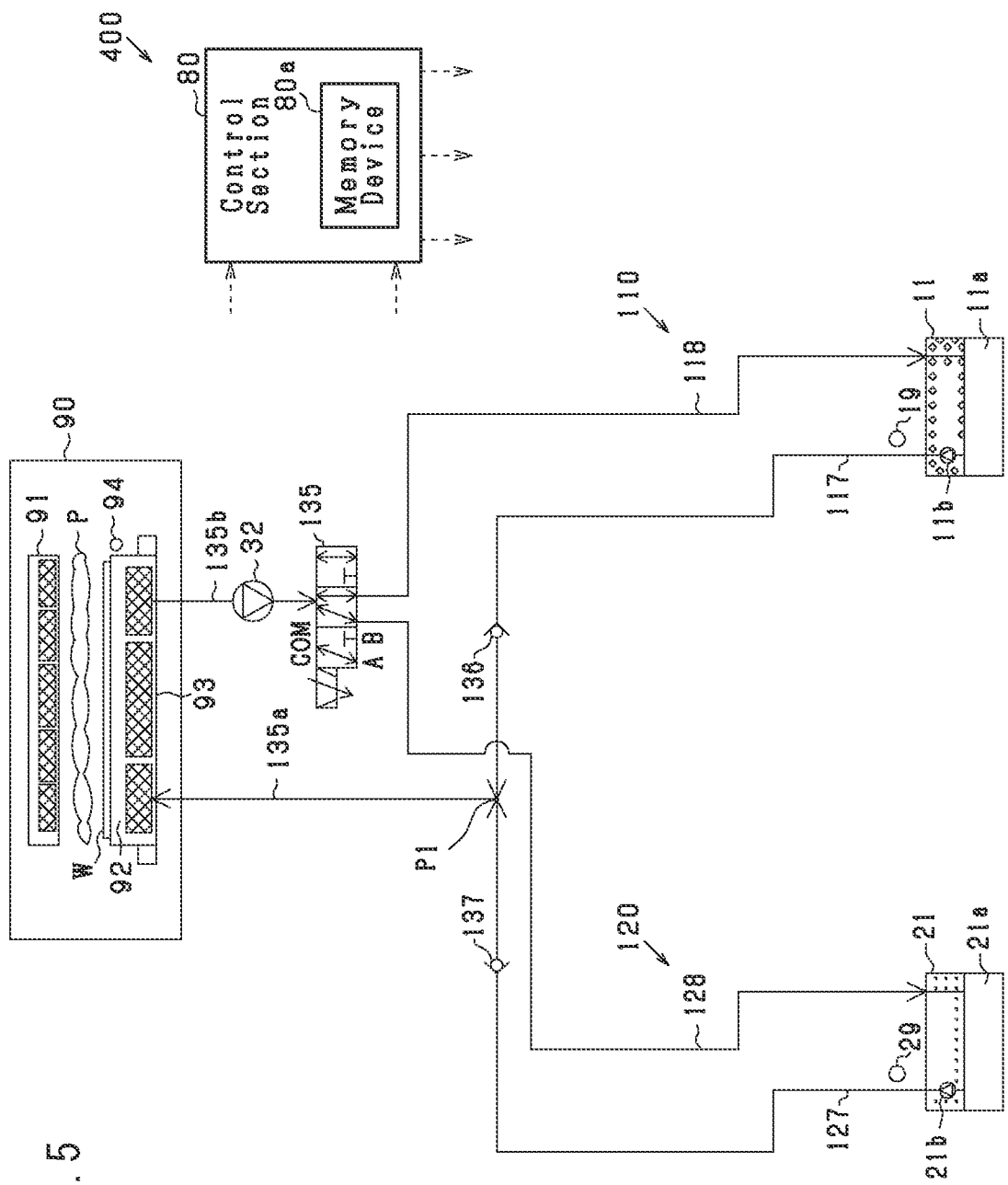
FIG. 5 is a schematic diagram of a temperature control system according to a fourth embodiment.

As shown in FIG. 5, a temperature control system 400 of the present embodiment is identical with the temperature control system 200 of the second embodiment except that the heater 121 is replaced with a second chiller 21.

The second chiller 21 (second adjustment apparatus) includes a tank 21a, a pump 21b, etc. The second chiller 21 adjusts the temperature of the second heat transfer medium to a set temperature Th (second set temperature) higher than the set temperature Tc (first set temperature). The second heat transfer medium is the same liquid as the first heat transfer medium. Namely, the first circulation circuit 110 and the second circulation circuit 120 are circuits through which the above-described first heat transfer medium (common heat transfer medium) used in common circulates. The tank 21a (second tank) stores the second heat transfer medium (i.e. first heat transfer medium) adjusted to the set temperature Th. The pump 21b discharges the first heat transfer medium stored in the tank 21a to the flow passage 127.

The control section 80 controls the set temperature Tc of the first chiller 11, the set temperature Th of the second chiller 21, and the distribution ratio of the second distribution valve 135 on the basis of the target temperature Te of the lower electrode 92 and the temperatures detected by the temperature sensors 19, 29, and 94. Thus, the flow rate of the first heat transfer medium flowing from the first chiller 11 to the heat exchanger 93 and the flow rate of the first heat transfer medium flowing from the second chiller 21 to the heat exchanger 93 are adjusted; as a result, the amount of heat supplied to the heat exchanger 93 is adjusted. Namely, the second distribution valve 135 adjusts the amount of heat supplied from the heat exchanger 93 to the lower electrode 92. In order to render the temperature of the lower electrode 92 coincident with the target temperature Te, the control section 80 sets the set temperature Tc of the first chiller 11 to a set temperature Tc corresponding to the target temperature Te, sets the set temperature Th of the second chiller 21 to a set temperature Th corresponding to the target temperature Te, and feedback-controls the distribution ratio of the second distribution valve 135.

Figure 6:
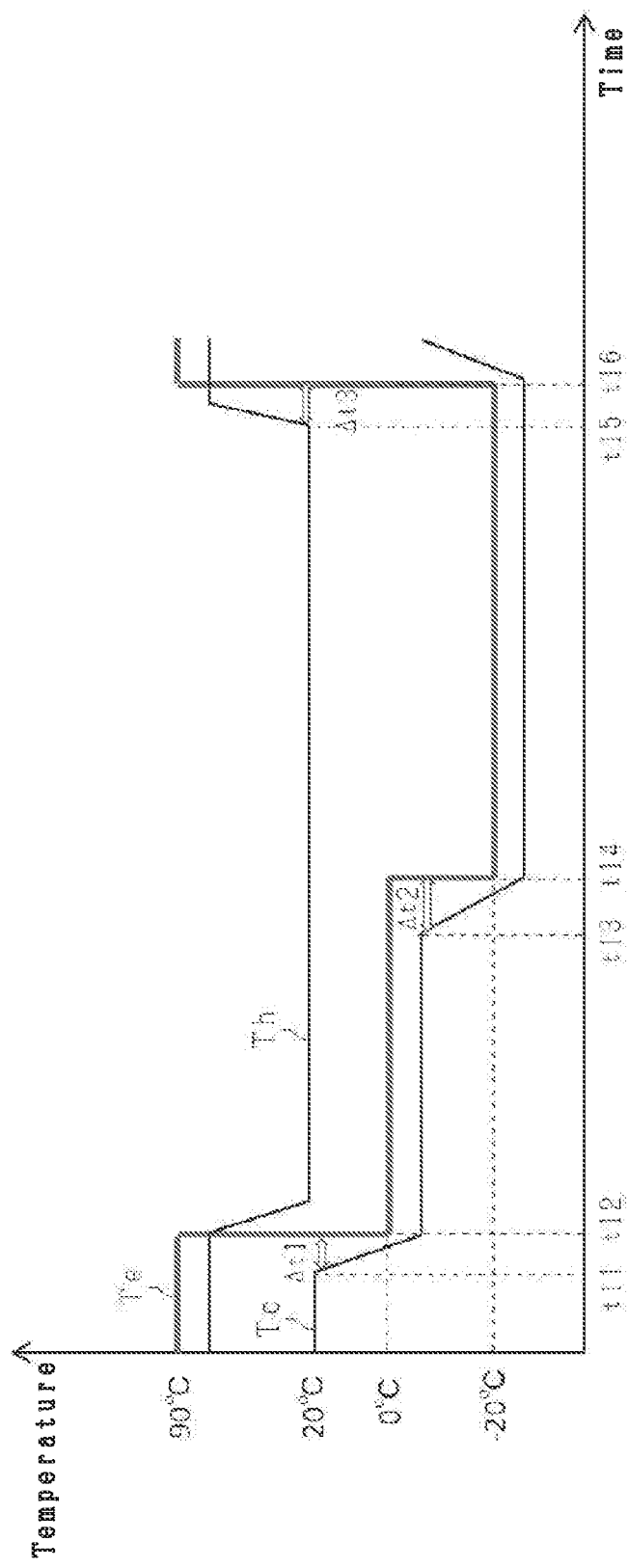
FIG. 6 is a time chart showing changes in the target temperature of the lower electrode, the set temperature of the first chiller, and the set temperature of a second chiller.

FIG. 6 is a time chart showing changes in the target temperature Te of the lower electrode 92, the set temperature Tc of the first chiller 11, and the set temperature Th of the second chiller 21. As shown in FIG. 6, the target temperature Te of the lower electrode 92 changes in the same manner as in the case shown in FIG. 2.

The control section 80 allows and stops the supply of the first heat transfer medium from the first chiller 11 and the second chiller 21 in accordance with changes in the target temperature Te. The first chiller 11 and the second chiller 21 start the supply of the first heat transfer medium by driving the pumps 11b and 21b, respectively, and stop the supply of the first heat transfer medium by stopping the pumps 11b and 21b. For example, in the case where the target temperature Te is higher than 20° C. (boundary temperature), the control section 80 stops the supply of the first heat transfer medium from the first chiller 11, and allows the supply of the first heat transfer medium from the second chiller 21. Meanwhile, in the case where the target temperature Te is equal to or lower than 20° C., the control section 80 allows the supply of the first heat transfer medium from the first chiller 11, and stops the supply of the first heat transfer medium from the second chiller 21.

The control section 80 sets the set temperature Tc of the first chiller 11 to a set temperature Tc corresponding to the target temperature Te. For example, when the target temperature Te is 90° C., the control section 80 sets the set temperature Tc to 20° C. and stops the pump 11b. When the target temperature Te is 0° C., the control section 80 sets the set temperature Tc to −5° C. and drives the pump 11b. Similarly, when the target temperature Te is −20° C., the control section 80 sets the set temperature Tc to −25° C. and drives the pump 11b. Subsequently, the control section 80 feedback-controls the output of the first chiller 11 such that the temperature T1 of the first heat transfer medium detected by the temperature sensor 19 becomes equal to the set temperature Tc. Also, the control section 80 feedback-controls the distribution ratio of the second distribution valve 135 such that the temperature T3 of the lower electrode 92 detected by the temperature sensor 94 becomes equal to the target temperature Te.

Also, the control section 80 sets the set temperature Th of the second chiller 21 to a set temperature Th corresponding to the target temperature Te. For example, when the target temperature Te is 90° C., the control section 80 sets the set temperature Th to 85° C. and drives the pump 21b. When the target temperature Te is 0° C., the control section 80 sets the set temperature Th to 20° C. and stops the pump 21b. Similarly, when the target temperature Te is −20° C., the control section 80 sets the set temperature Th to 20° C. and stops the pump 21b. Subsequently, the control section 80 feedback-controls the output of the second chiller 21 such that the temperature T2 of the first heat transfer medium detected by the temperature sensor 29 becomes equal to the set temperature Th. Also, the control section 80 feedback-controls the distribution ratio of the second distribution valve 135 such that the temperature T3 of the lower electrode 92 detected by the temperature sensor 94 becomes equal to the target temperature Te.

Further, the control section 80 sets the set temperature Tc on the basis of the above-described relation stored in the memory device 80a. Specifically, at the point in time which precedes, by the predetermined time Δt, the change timing at which the target temperature Te changes from the target temperature Te1 to the target temperature Te2, the control section 80 sets the set temperature Tc to a set temperature Tc2 corresponding to the post-change target temperature Te2. Subsequently, in order to control the temperature of the lower electrode 92 to the pre-change target temperature Te1 until the change timing, the control section 80 controls the second distribution valve 135 so as to adjust the ratio of distribution of the first heat transfer medium between the flow passage 118 and the flow passage 128. As a result, the first heat transfer medium adjusted to the set temperature Tc2 corresponding to the post-change target temperature Te2 is stored in the tank 11a by the change timing.

For example, at time t11 which precedes time t12 by a predetermined time Δt1, the control section 80 sets the set temperature Tc such that the set temperature Tc gradually changes to a set temperature Tc2 (=−5° C.) corresponding to the post-change target temperature Te2 (=0° C.). At that time, the pump 11b of the first chiller 11 is not driven, the control section 80 does not change the distribution ratio of the second distribution valve 135. Namely, the first chiller 11 stores in the tank 11a the first heat transfer medium whose temperature has been adjusted to the set temperature Tc2 (=−5° C.) in a state in which the first chiller 11 stops the supply of the first heat transfer medium. Notably, instead of gradually changing the set temperature Tc at time t11, the set temperature Tc may be instantaneously set to the set temperature Tc2 (=−5° C.) corresponding to the post-change target temperature Te2 (=0° C.)

Also, at time t13 which precedes time t14 by a predetermined time Δt2, the control section 80 sets the set temperature Tc such that the set temperature Tc gradually changes to a set temperature Tc3 (=−25° C.) corresponding to a post-change target temperature Te3 (=−20° C.) Also, in order to control the temperature of the lower electrode 92 to the pre-change target temperature Te2 (=0° C.) until time t14, the control section 80 controls the second distribution valve 135 to decrease the ratio of distribution of the first heat transfer medium to the flow passage 118 and increase the ratio of distribution of the first heat transfer medium to the flow passage 128. Notably, instead of gradually changing the set temperature Tc at time t13, the set temperature Tc may be instantaneously set to the set temperature Tc3 (=−25° C.) corresponding to the post-change target temperature Te3 (=−20° C.)

Also, at time t15 which precedes time t16 by a predetermined time Δt3, the control section 80 sets the set temperature Th such that the set temperature Th gradually changes to a set temperature Th4 (=85° C.) corresponding to a post-change target temperature Te4 (=90° C.). At that time, the pump 21b of the second chiller 21 is not driven, the control section 80 does not change the distribution ratio of the second distribution valve 135. Namely, the second chiller 21 stores in the tank 21a the first heat transfer medium whose temperature has been adjusted to the set temperature Tc4 (=85° C.) in a state in which the second chiller 21 stops the supply of the first heat transfer medium. Notably, instead of gradually changing the set temperature Th at time t15, the set temperature Th may be instantaneously set to the set temperature Th4 (=85° C.) corresponding to the post-change target temperature Te4 (=90° C.)

In the same manner as in the first embodiment, the control section 80 sets the predetermined time Δt in accordance with an equation of $\Delta t = C \times (T1 - Tc2)/q$. The output q may be the maximum output qm or the maximum efficiency output qe. Notably, in the case where the first chiller 11 has already operated to produce an output ql, the difference (qm−ql) between the maximum output qm and the output ql or the difference (qe−ql) between the maximum output qm and the output ql may be used as the output q. Also, in the case where heating is performed by the second chiller 21, the control section 80 sets the predetermined time Δt in accordance with an equation of $\Delta t = C \times (Th2 - T2)/q$. The temperature T2 is the temperature of the second heat transfer medium detected by the temperature sensor 29.

The present embodiment having been described in detail above has the following advantages. Notably, only the advantages different from those of the second embodiment will be described.

The temperature control system 400 includes the first chiller 11, the first circulation circuit 110, the second chiller 21, and the second circulation circuit 120. Therefore, the temperature of the lower electrode 92 can be controlled to the target temperature Te by causing the first heat transfer medium (second heat transfer medium) to flow from the first chiller 11 and the second chiller 21 to the heat exchanger 93 (first flow-through section, second flow-through section) and supplying heat from the heat exchanger 93 to the lower electrode 92.

The control section 80 sets the set temperature Tc on the basis of the relation between lapse of time and the target temperature Te, which relation is stored in the memory device 80a. Specifically, as shown in FIG. 6, at the point in time which precedes, by the predetermined time Δt1, time t12 (first change timing) at which the target temperature Te changes to the target temperature Te2 (=0° C.) to be reached by supplying the first heat transfer medium from the first chiller 11 to the heat exchanger 93, the control section 80 sets the set temperature Tc to the set temperature Tc2 corresponding to the post-change target temperature Te2 (=0° C.). Therefore, by time t12, the first chiller 11 can store in the tank 11a the first heat transfer medium adjusted to the set temperature Tc2 corresponding to the post-change target temperature Te2 (=0° C.) in a state in which the first chiller 11 stops the supply of the first heat transfer medium. Accordingly, after the target temperature Te has changed, the first chiller 11 can supply from the tank 11a the first heat transfer medium whose temperature has been adjusted beforehand, thereby enhancing the followability of the temperature of the lower electrode 92 to the target temperature Te2 (=0° C.). The only action required is to set the set temperature Tc to the set temperature Tc2 corresponding to the post-change target temperature Te2 (=0° C.) at the point in time which precedes time t12 by the predetermined time Δt1, and maintaining the drive state of the first chiller 11 at a high level at all times is unnecessary. Therefore, the energy consumption of the first chiller 11 can be reduced.

Notably, the flow passage 116 which connects the flow passage 117 and the flow passage 118 together may be provided, and the needle valve 119 which adjusts the amount of the first heat transfer medium circulating from the flow passage 117 to the flow passage 118 may be provided in the flow passage 116. Similarly, the flow passage 126 which connects the flow passage 127 and the flow passage 128 together may be provided, and the needle valve 129 which adjusts the amount of the first heat transfer medium circulating from the flow passage 127 to the flow passage 128 may be provided in the flow passage 126.

Fifth Embodiment

A fifth embodiment will now be described. In the following description, the difference between the fifth embodiment and the fourth embodiment will be mainly described. Notably, portions identical with those of the first through fourth embodiments are denoted by the same reference numerals, and their description will not be repeated.

Figure 7:
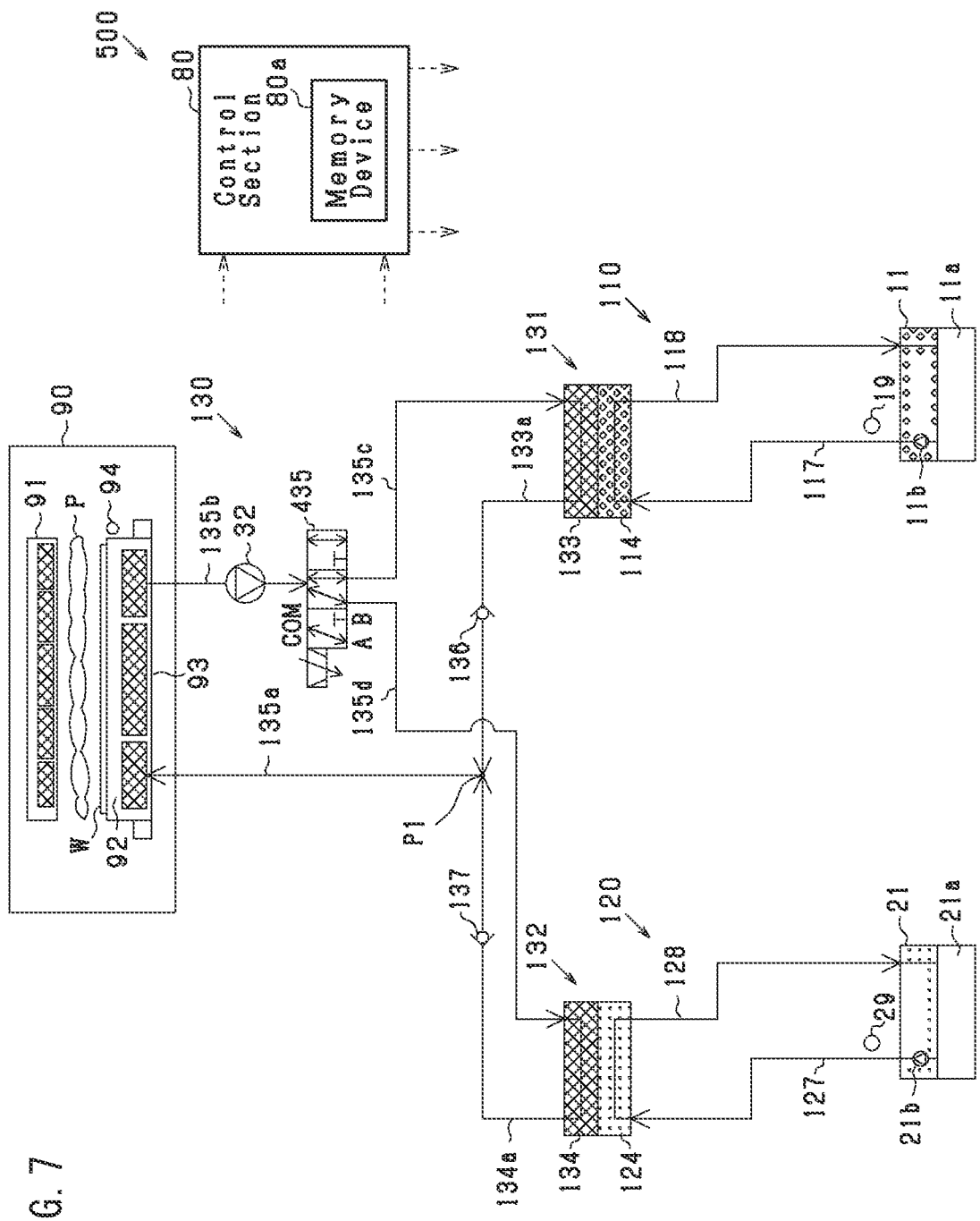
FIG. 7 is a schematic diagram of a temperature control system according to a fifth embodiment.

As shown in FIG. 7, a temperature control system 500 of the present embodiment includes the first circulation circuit 110, the second circulation circuit 120, a third circulation circuit 130, the control section 80, etc.

The first circulation circuit 110 is a circuit through which the above-described first heat transfer medium circulates. The second circulation circuit 120 is a circuit which is independent of the first circulation circuit 110 and through which the above-described second heat transfer medium circulates. The third circulation circuit 130 is a circuit which is independent of the first circulation circuit 110 and the second circulation circuit 120 and through which a third heat transfer medium circulates.

The third heat transfer medium is, for example, a fluorine-based inert liquid. The lowest usable temperature of the third heat transfer medium is lower than those of the first heat transfer medium and the second heat transfer medium. The highest usable temperature of the third heat transfer medium is higher than those of the first heat transfer medium and the second heat transfer medium. Namely, the usable temperature range of the third heat transfer medium is wider than those of the first heat transfer medium and the second heat transfer medium. Therefore, the third heat transfer medium is more expensive than the first heat transfer medium and the second heat transfer medium.

The first circulation circuit 110 includes the first chiller 11, a first flow-through section 114, etc. The flow passage 117 is connected to the first flow-through section 114. The first flow-through section 114 is provided inside a heat exchanger 131, and the first heat transfer medium flows through the first flow-through section 114. The flow passage 118 is connected to the first flow-through section 114. The flow passage 118 is connected to the tank 11a of the first chiller 11.

The second circulation circuit 120 includes the second chiller 21, a second flow-through section 124, etc. The flow passage 127 is connected to the second flow-through section 124. The second flow-through section 124 is provided inside a heat exchanger 132, and the second heat transfer medium flows through the second flow-through section 124. The flow passage 128 is connected to the second flow-through section 124. The flow passage 128 is connected to the tank 21a of the second chiller 21.

The third circulation circuit 130 includes a third flow-through section 133, a fourth flow-through section 134, a fourth distribution valve 435, the first check valve 136, the second check valve 137, the pump 32, etc.

The third flow-through section 133 is provided inside the heat exchanger 131, and the third heat transfer medium flows through the third flow-through section 133. The third flow-through section 133 is integrated with the first flow-through section 114 and exchange heat with the first flow-through section 114.

A flow passage 133a is connected to the third flow-through section 133. The first check valve 136 is provided in the flow passage 133a. The first check valve 136 permits the third heat transfer medium to flow from the third flow-through section 133 to the merging point P1 and prohibits the third heat transfer medium from flowing from the merging point P1 to the third flow-through section 133.

A flow passage 134a is connected to the fourth flow-through section 134. The second check valve 137 is provided in the flow passage 134a. The second check valve 137 permits the third heat transfer medium to flow from the fourth flow-through section 134 to the merging point P1 and prohibits the third heat transfer medium from flowing from the merging point P1 to the fourth flow-through section 134.

The flow passage 133a and the flow passage 134a are connected to the flow passage 135a at the merging point P1. The flow passage 135a is connected to the inlet port of the heat exchanger 93. The flow passage 135b is connected to the outlet port of the heat exchanger 93. The pump 32 is provided in the flow passage 135b. The flow passage 135b is connected to the common port of the fourth distribution valve 435.

The fourth distribution valve 435 (adjustment section) is a three-way valve having the common port, an A port, and a B port. A flow passage 135c is connected to the B port. A flow passage 135d is connected to the A port. The flow passage 135c is connected to the third flow-through section 133 of the heat exchanger 131. The flow passage 135d is connected to the fourth flow-through section 134 of the heat exchanger 132.

The fourth distribution valve 435 continuously changes the ratio between the flow rate of the third heat transfer medium flowing from the flow passage 135b to the flow passage 135c and the flow rate of the third heat transfer medium flowing from the flow passage 135b to the flow passage 135d. Namely, the fourth distribution valve 435 changes the ratio between the third heat transfer medium flowing from the heat exchanger 93 to the third flow-through section 133 and the third heat transfer medium flowing from the heat exchanger 93 to the fourth flow-through section 134. The fourth distribution valve 435 continuously changes the state of flow between a state in which all (100%) of the third heat transfer medium flows from the flow passage 135b to the flow passage 135c and a state in which all (100%) of the third heat transfer medium flows from the flow passage 135b to the flow passage 135d. In the fourth distribution valve 435, the pressure loss of the third heat transfer medium is constant irrespective of the ratio at which the third heat transfer medium supplied from the pump 32 is distributed between the third flow-through section 133 of the heat exchanger 131 and the fourth flow-through section 134 of the heat exchanger 132.

Since the load of the pump 32 does not change irrespective of the distribution ratio of the fourth distribution valve 435, the pump 32 is driven in a constant drive state. As a result, the pump 32 circulates the third heat transfer medium through the third circulation circuit 130. The third circulation circuit 130 does not include a tank for storing the third heat transfer medium.

The control section 80 controls the temperature of the lower electrode 92 to the target temperature Te. The control section 80 controls the distribution ratio of the fourth distribution valve 435 on the basis of the target temperature Te of the lower electrode 92 and the temperature detected by the temperature sensor 94. Thus, the flow rate of the third heat transfer medium flowing through the third flow-through section 133 is adjusted; as a result, the amount of heat exchanged between the first flow-through section 114 and the third flow-through section 133 is adjusted. Also, the flow rate of the third heat transfer medium flowing through the fourth flow-through section 134 is adjusted; as a result, the amount of heat exchanged between the second flow-through section 124 and the fourth flow-through section 134 is adjusted.

The control section 80 controls the set temperature Tc of the first chiller 11, the set temperature Th of the second chiller 21, and the distribution ratio of the fourth distribution valve 435 on the basis of the target temperature Te of the lower electrode 92 and the temperatures detected by the temperature sensors 19, 29, and 94. Thus, the amount of heat supplied to the heat exchanger 93 is adjusted. In order to render the temperature of the lower electrode 92 coincident with the target temperature Te, the control section 80 sets the set temperature Tc of the first chiller 11 to a set temperature Tc corresponding to the target temperature Te, sets the set temperature Th of the second chiller 21 to a set temperature Th corresponding to the target temperature Te, and feedback-controls the distribution ratio of the fourth distribution valve 435.

In the same manner as in the fourth embodiment, the control section 80 controls the set temperature Tc of the first chiller 11, the set temperature Th of the second chiller 21, and the distribution ratio of the fourth distribution valve 435. Also, in the same manner as in the fourth embodiment, the control section 80 may allow and stop the supply of the first heat transfer medium from the first chiller 11, and allow and stop the supply of the second heat transfer medium from the second chiller 21. Alternatively, the control section 80 may allow the first chiller 11 to supply the first heat transfer medium at all times and allow the second chiller 21 to supply the second heat transfer medium at all times.

The present embodiment having been described in detail above has the following advantages. Notably, only the advantages different from those of the fourth embodiment will be described.

The third circulation circuit 130 is independent of the first circulation circuit 110 and the second circulation circuit 120, and the third heat transfer medium whose usable temperature range is wider than that of the first heat transfer medium circulates through the third circulation circuit 130. Therefore, the third heat transfer medium, which may be expensive, is caused to circulate only through the third circulation circuit 130, whereby the amount of use of the third heat transfer medium can be reduced. Additionally, the third circulation circuit 130 does not include a tank for storing the third heat transfer medium. Therefore, the amount of the third heat transfer medium circulating through the third circulation circuit 130 can be reduced further.

The third circulation circuit 130 includes the third flow-through section 133 through which the third heat transfer medium flows and which exchanges heat with the first flow-through section 114, and the fourth flow-through section 134 through which the third heat transfer medium flows and which exchanges heat with the second flow-through section 124. Therefore, the thermal energy supplied to the first flow-through section 114 can be supplied to the third flow-through section 133 through heat exchange between the first flow-through section 114 and the third flow-through section 133. Similarly, the thermal energy supplied to the second flow-through section 124 can be supplied to the fourth flow-through section 134 through heat exchange between the second flow-through section 124 and the fourth flow-through section 134. The third circulation circuit 130 causes the third heat transfer medium to flow from the third flow-through section 133 and the fourth flow-through section 134 to the heat exchanger 93, which exchanges heat with the lower electrode 92, and return to the third flow-through section 133 and the fourth flow-through section 134. Therefore, via the third heat transfer medium, thermal energy can be supplied from the third flow-through section 133 and the fourth flow-through section 134 to the heat exchanger 93, which exchanges heat with the lower electrode 92.

The fourth distribution valve 435 changes the ratio between the third heat transfer medium flowing from the heat exchanger 93 to the third flow-through section 133 and the third heat transfer medium flowing from the heat exchanger 93 to the fourth flow-through section 134. Therefore, the ratio between the amount of heat supplied from the third flow-through section 133 to the heat exchanger 93 and the amount of heat supplied from the fourth flow-through section 134 to the heat exchanger 93 can be changed by the fourth distribution valve 435. Accordingly, the temperature of the lower electrode 92 can be controlled to the target temperature Te by changing the amount of heat supplied to the heat exchanger 93 by using the fourth distribution valve 435.

Even in the case where the set temperature Tc is set to a set temperature Tc corresponding to the post-change target temperature Te at the point in time which precedes the above-described first change timing by the predetermined time Δt, deviation of the temperature of the lower electrode 92 from the target temperature Te can be prevented by changing the amount of heat supplied to the heat exchanger 93 by using the fourth distribution valve 435.

The amount of the third heat transfer medium circulating through the third circulation circuit 130 can be reduced. Accordingly, the temperature of the third heat transfer medium can be changed quickly, whereby responsiveness in controlling the temperature of the lower electrode 92 can be enhanced.

Sixth Embodiment

A sixth embodiment will now be described. In the following description, the difference between the sixth embodiment and the fifth embodiment will be mainly described. Notably, portions identical with those of the first through fifth embodiments are denoted by the same reference numerals, and their description will not be repeated.

Figure 8:
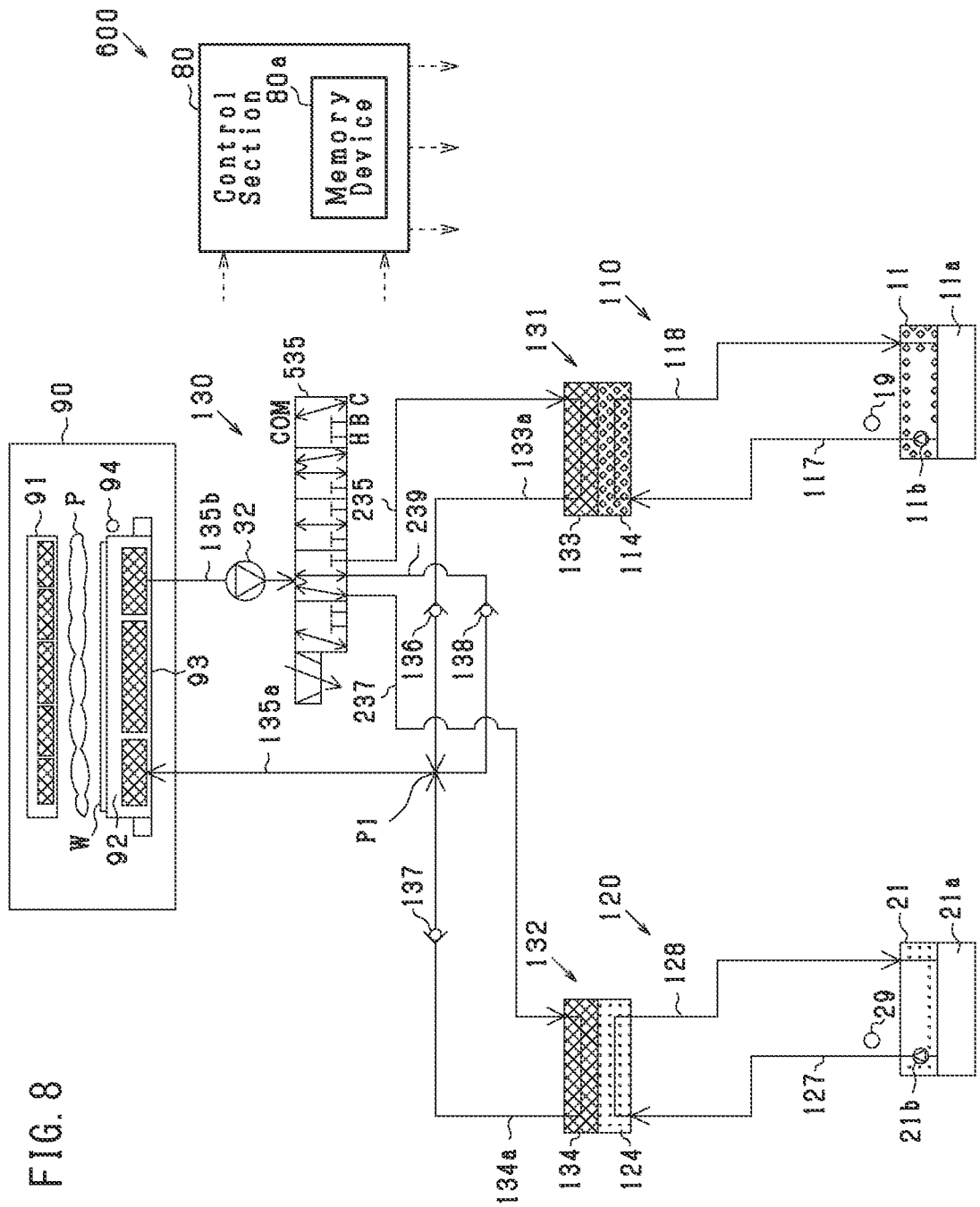
FIG. 8 is a schematic diagram of a temperature control system according to a sixth embodiment.

As shown in FIG. 8, a temperature control system 600 of the present embodiment is identical with the temperature control system 500 of the fifth embodiment except that the fourth distribution valve 435 is replaced with a fifth distribution valve 535.

The fifth distribution valve 535 (adjustment section) is a four-way valve having a common port, an H port, a B port, and a C port. The flow passage 235 is connected to the C port. The flow passage 235 is connected to the third flow-through section 133 of the heat exchanger 131. The flow passage 239 is connected to the B port. The flow passage 239 is connected to the flow passage 135a at the merging point P1. The third check valve 138 is provided in the flow passage 239. The third check valve 138 permits the first heat transfer medium to flow from the fifth distribution valve 535 to the merging point P1 and prohibits the first heat transfer medium from flowing from the merging point P1 to the fifth distribution valve 535. The flow passage 237 is connected to the H port. The flow passage 237 is connected to the fourth flow-through section 134 of the heat exchanger 132.

The fifth distribution valve 535 continuously changes the ratio among the flow rate of the third heat transfer medium flowing from the flow passage 135b to the flow passage 235, the flow rate of the third heat transfer medium flowing from the flow passage 135b to the flow passage 239, and the flow rate of the third heat transfer medium flowing from the flow passage 135b to the flow passage 237. Namely, the fifth distribution valve 535 changes the ratio among the third heat transfer medium flowing from the heat exchanger 93 to the third flow-through section 133, the third heat transfer medium flowing out of the heat exchanger 93 and returning to the heat exchanger 93 without flowing through the third flow-through section 133 and the fourth flow-through section 134, and the third heat transfer medium flowing from the heat exchanger 93 to the fourth flow-through section 134. The fifth distribution valve 535 continuously changes the state of flow among a state in which all (100%) of the third heat transfer medium flows from the flow passage 135b to the flow passage 235, a state in which the third heat transfer medium flows from the flow passage 135b to the flow passages 235 and 239, a state in which all (100%) of the third heat transfer medium flows from the flow passage 135b to the flow passage 239, a state in which the third heat transfer medium flows from the flow passage 135b to the flow passages 239 and 237, and a state in which all (100%) of the third heat transfer medium flows from the flow passage 135b to the flow passage 237. In the fifth distribution valve 535, the pressure loss of the third heat transfer medium is constant irrespective of the ratio at which the third heat transfer medium supplied from the pump 32 is distributed among the flow passages 235, 239, and 237.

Since the load of the pump 32 does not change irrespective of the distribution ratio of the fifth distribution valve 535, the pump 32 is driven in a constant drive state. As a result, the pump 32 circulates the third heat transfer medium through the heat exchanger 93.

The control section 80 controls the temperature of the lower electrode 92 to the target temperature Te. The control section 80 controls the distribution ratio of the fifth distribution valve 535 on the basis of the target temperature Te of the lower electrode 92 and the temperature detected by the temperature sensor 94. Also, in the same manner as the manner shown in FIG. 6, in response to each change in the target temperature Te, the control section 80 sets the set temperature Tc of the first chiller 11 to a set temperature Tc corresponding to the target temperature Te and sets the set temperature Th of the second chiller 21 to a set temperature Th corresponding to the target temperature Te.

The present embodiment having been described in detail above has the following advantages. Notably, only the advantages different from those of the fifth embodiment will be described.

The fifth distribution valve 535 changes the ratio among the third heat transfer medium flowing from the heat exchanger 93 to the third flow-through section 133, the third heat transfer medium flowing out of the heat exchanger 93 and returning to the heat exchanger 93 without flowing through the third flow-through section 133 and the fourth flow-through section 134, and the third heat transfer medium flowing from the heat exchanger 93 to the fourth flow-through section 134. Therefore, the ratio among the amount of heat that the heat exchanger 93 receives from the third flow-through section 133, the amount of heat returned to the heat exchanger 93, and the amount of heat that the heat exchanger 93 receives from the fourth flow-through section 134 can be changed by the fifth distribution valve 535. Accordingly, the temperature of the lower electrode 92 can be controlled to the target temperature Te by changing the amount of heat supplied to the heat exchanger 93 by using the fifth distribution valve 535.

Even in the case where the set temperature Tc is set to a set temperature Tc corresponding to the post-change target temperature Te at the point in time which precedes the first change timing by the predetermined time Δt, deviation of the temperature of the lower electrode 92 from the target temperature Te can be prevented by changing the amount of heat supplied to the heat exchanger 93 by using the fifth distribution valve 535.

It is possible to realize a state in which the third heat transfer medium flowing out of the heat exchanger 93 is returned as it is to the heat exchanger 93 without allowing the third heat transfer medium to flow from the heat exchanger 93 to the third flow-through section 133 and the fourth flow-through section 134.

Seventh Embodiment

A seventh embodiment will now be described. In the following description, the difference between the seventh embodiment and the first and fifth embodiments will be mainly described. Notably, portions identical with those of the first through sixth embodiments are denoted by the same reference numerals, and their description will not be repeated.

Figure 9:
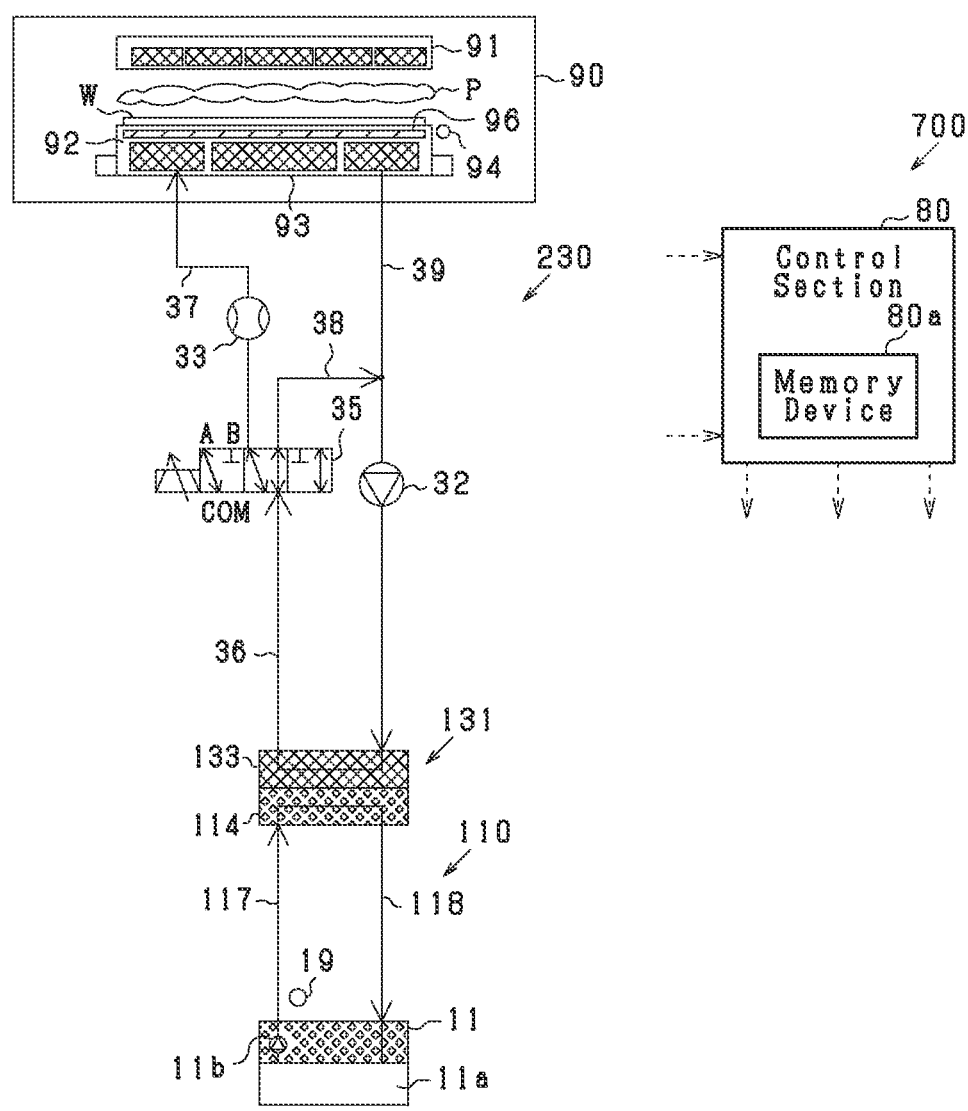
FIG. 9 is a schematic diagram of a temperature control system according to a seventh embodiment.

As shown in FIG. 9, a temperature control system 700 of the present embodiment includes a heater 96 for directly heating the lower electrode 92, instead of the second circulation circuit 120 of the temperature control system 500 of the fifth embodiment.

The first circulation circuit 110 is a circuit through which the above-described first heat transfer medium circulates. A third circulation circuit 230 is a circuit which is independent of the first circulation circuit 110 and through which the above-described third heat transfer medium circulates.

The heater 96 is a heater which can control the amount of heat generated. The heater 96 includes a heating wire heater, a ceramic heater, or the like and is integrated with the lower electrode 92. The heating state of the heater 96 is controlled by the control section 80 (adjustment section).

A sixth distribution valve 35 (adjustment section) is a three-way valve having a common port, an A port, and a B port. The third flow-through section 133 and the common port of the sixth distribution valve 35 are connected to each other by a flow passage 36. The A port of the sixth distribution valve 35 and the inlet port of the heat exchanger 93 are connected to each other by a flow passage 37. A flowmeter 33 is provided in the flow passage 37. The flowmeter 33 measures the flow rate of the third heat transfer medium flowing through the flow passage 37.

The outlet port of the heat exchanger 93 and the third flow-through section 133 are connected to each other by a flow passage 39. The B port of the sixth distribution valve 35 and the flow passage 39 are connected to each other by a flow passage 38. The pump 32 is provided in the flow passage 39. In the flow passage 39, the pump 32 sucks the third heat transfer medium from the heat exchanger 93 side and discharges the third heat transfer medium toward the third flow-through section 133.

The sixth distribution valve 35 continuously changes the ratio between the flow rate of the third heat transfer medium flowing from the flow passage 36 to the flow passage 37 and the flow rate of the third heat transfer medium flowing from the flow passage 36 to the flow passage 38. Namely, the sixth distribution valve 35 changes the ratio between the third heat transfer medium flowing from the third flow-through section 133 to the heat exchanger 93 and the third heat transfer medium flowing out of the third flow-through section 133 and returning to the third flow-through section 133 without flowing through the heat exchanger 93. The sixth distribution valve 35 continuously changes the state of flow between a state in which all (100%) of the third heat transfer medium flows from the third flow-through section 133 to the heat exchanger 93 and a state in which all (100%) of the third heat transfer medium flowing out of the third flow-through section 133 returns to the third flow-through section 133 without flowing through the heat exchanger 93. In the sixth distribution valve 35, the pressure loss of the third heat transfer medium is constant irrespective of the ratio at which the third heat transfer medium supplied from the third flow-through section 133 is distributed to the heat exchanger 93.

Since the load of the pump 32 does not change irrespective of the distribution ratio of the sixth distribution valve 35, the pump 32 is driven in a constant drive state. As a result, the pump 32 circulates the third heat transfer medium through the third circulation circuit 230. The third circulation circuit 230 does not include a tank for storing the third heat transfer medium.

The control section 80 controls the temperature of the lower electrode 92 to the target temperature Te. The control section 80 controls the distribution ratio of the sixth distribution valve 35 on the basis of the target temperature Te of the lower electrode 92, and the results of the detections performed by the flowmeter 33 and the temperature sensor 94. Thus, the flow rate of the third heat transfer medium flowing to the third flow-through section 133 is adjusted; as a result, the amount of heat exchanged between the first flow-through section 114 and the third flow-through section 133 is adjusted.

The control section 80 controls the set temperature Tc of the first chiller 11, the heat generation amount of the heater 96, and the distribution ratio of the sixth distribution valve 35 on the basis of the target temperature Te of the lower electrode 92, and the results of the detections performed by the temperature sensors 19 and 94. As a result, the amount of heat supplied from the heat exchanger 93 is adjusted. In order to render the temperature of the lower electrode 92 coincident with the target temperature Te, the control section 80 sets the set temperature Tc of the first chiller 11 to a set temperature Tc corresponding to the target temperature Te, controls the heat generation amount of the heater 96 to a heat generation amount corresponding to the target temperature Te, and feedback-controls the distribution ratio of the sixth distribution valve 35.

In the same manner as in the first embodiment, the control section 80 controls the set temperature Tc of the first chiller 11 and the distribution ratio of the sixth distribution valve 35. Also, in the same manner as in the fifth embodiment, the control section 80 may allow and stop the supply of the first heat transfer medium from the first chiller 11 or may allow the first chiller 11 to supply the first heat transfer medium at all times.

In the case shown in FIG. 2, at time t3 which precedes time t4 by the predetermined time Δt2, the control section 80 sets the set temperature Tc such that the set temperature Tc gradually changes to a set temperature Tc (=−25° C.) corresponding to the post-change target temperature Te3 (=−20° C.). Also, in order to control the temperature of the lower electrode 92 to the pre-change target temperature Te2 (=0° C.) until time t4, the control section 80 controls the sixth distribution valve 35 to decrease the ratio of distribution of the third heat transfer medium to the flow passage 38 and increase the ratio of distribution of the third heat transfer medium to the flow passage 37. At that time, the lower electrode 92 is heated by the heater 96.

Notably, during the predetermined time Δt2, the heater 96 may be stopped (heating of the lower electrode 92 may be stopped). In such a case, by the sixth distribution valve 35, the ratio of distribution of the third heat transfer medium to the flow passage 38 is decreased, and the ratio of distribution of the third heat transfer medium to the flow passage 37 is increased. Also, the lower electrode 92 may be heated by the heater 96 without changing the distribution ratio of the sixth distribution valve 35. By these operations as well, during the period from time t3 to time t4, the temperature of the lower electrode 92 can be controlled to the pre-change target temperature Te2 (=0° C.)

At time t5 of FIG. 2, the control section 80 sets the set temperature Tc such that the set temperature Tc gradually changes to a set temperature (=50° C.) corresponding to the post-change target temperature Te4 (=90° C.). Also, the control section 80 controls the sixth distribution valve 35 to decrease the ratio of distribution of the third heat transfer medium to the flow passage 38 and increase the ratio of distribution of the third heat transfer medium to the flow passage 37. At that time, the control section 80 causes the heater 96 to heat the lower electrode 92, thereby raising the temperature of the lower electrode 92 sharply.

The present embodiment having been described in detail above has the following advantages. Notably, only the advantages different from those of the first and fifth embodiments will be described.

The third circulation circuit 230 is independent of the first circulation circuit 110, and the third heat transfer medium whose usable temperature range is wider than that of the first heat transfer medium circulates through the third circulation circuit 230. Therefore, the third heat transfer medium, which may be expensive, is caused to circulate only through the third circulation circuit 230, whereby the amount of the third heat transfer medium to be used can be reduced. Additionally, the third circulation circuit 230 does not include a tank for storing the third heat transfer medium. Therefore, the amount of the third heat transfer medium circulating through the third circulation circuit 230 can be reduced further.

The first circulation circuit 110 uses the first heat transfer medium whose usable temperature range is narrower than that of the third heat transfer medium. Therefore, an inexpensive heat transfer medium can be used as the first heat transfer medium. The heater 96 can heat the lower electrode 92 and can control its heat generation amount. Therefore, the lower electrode 92 can be heated directly without use of a heat transfer medium.

The temperature control system 700 includes the sixth distribution valve 35 which adjusts the amount of heat exchanged between the first flow-through section 114 and the third flow-through section 133. Also, the temperature control system 700 includes the control section 80 which adjusts the heat generation amount of the heater 96. Therefore, the amount of heat supplied from the third flow-through section 133 to the heat exchanger 93 and the amount of heat supplied directly to the lower electrode 92 can be adjusted, whereby the temperature of the lower electrode 92 can be controlled to the target temperature Te. Accordingly, even in the case where the set temperature Tc is set to a set temperature Tc corresponding to the post-change target temperature Te at the point in time which precedes the change timing by the predetermined time, deviation of the temperature of the lower electrode 92 from the target temperature Te can be prevented by changing the amount of heat supplied to the heat exchanger 93 by using the sixth distribution valve 35 and the control section 80.

The control section 80 also adjusts the amount of heat supplied from the heater 96 directly to the lower electrode 92. Therefore, even in the case where it is difficult to control the temperature of the lower electrode 92 to the target temperature Te by merely adjusting the amount of heat supplied from the first flow-through section 114 to the third flow-through section 133 and thus to the lower electrode 92 by using the sixth distribution valve 35, it is possible to prevent deviation of the temperature of the lower electrode 92 from the target temperature Te.

The heater 96 can heat the lower electrode 92 and can control its heat generation amount. Therefore, the lower electrode 92 can be heated directly without use of a heat transfer medium, whereby the configuration can be simplified.

Eighth Embodiment

An eighth embodiment will now be described. In the following description, the difference between the eighth embodiment and the fifth embodiment will be mainly described. Notably, portions identical with those of the first through seventh embodiments are denoted by the same reference numerals, and their description will not be repeated.

Figure 10:
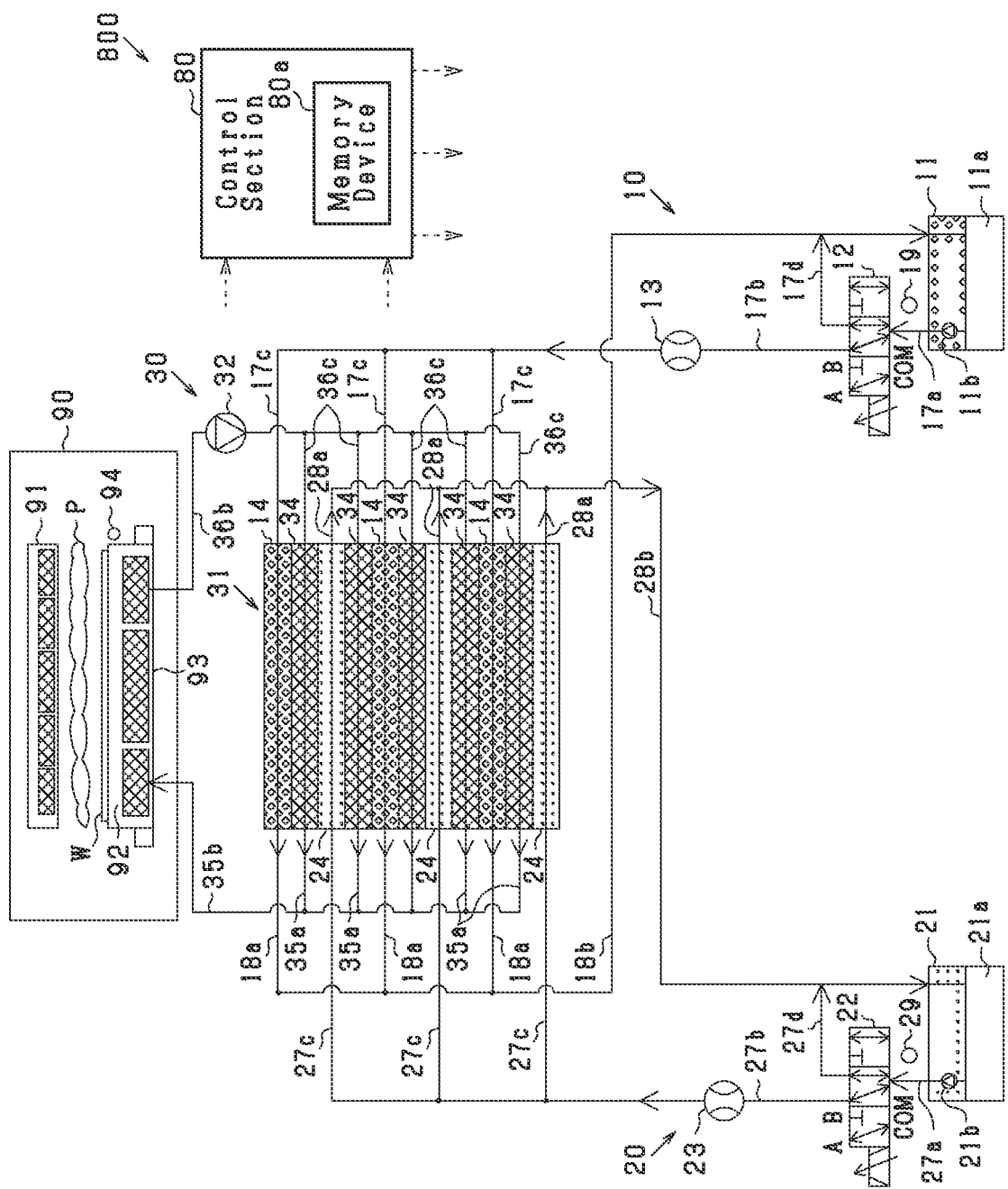
FIG. 10 is a schematic diagram of a temperature control system according to an eighth embodiment.

As shown in FIG. 10, a temperature control system 800 of the present embodiment includes a first circulation circuit 10, a second circulation circuit 20, a third circulation circuit 30, the control section 80, etc.

The first circulation circuit 10 is a circuit through which the above-described first heat transfer medium circulates. The second circulation circuit 20 is a circuit which is independent of the first circulation circuit 10 and through which the above-described second heat transfer medium (i.e., the first heat transfer medium) circulates.

The third circulation circuit 30 is a circuit which is independent of the first circulation circuit 10 and the second circulation circuit 20 and through which the above-described third heat transfer medium circulates.

The first circulation circuit 10 includes the first chiller 11, a first distribution valve 12, a flowmeter 13, three (a plurality of) first flow-through sections 14, etc.

The first chiller 11 (first adjustment apparatus) includes a tank 11a, a pump 11b, etc. A flow passage 17a is connected to the common port (COM) of the first distribution valve 12.

The first distribution valve 12 (adjustment section) is a three-way valve having the common port, an A port, and a B port. A flow passage 17b is connected to the A port. A flow passage 17d is connected to the B port. The first distribution valve 12 continuously changes the ratio between the flow rate of the first heat transfer medium flowing from the flow passage 17a to the flow passage 17b and the flow rate of the first heat transfer medium flowing from the flow passage 17a to the flow passage 17d. The first distribution valve 12 continuously changes the state of flow between a state in which all (100%) of the first heat transfer medium flows from the flow passage 17a to the flow passage 17b and a state in which all (100%) of the first heat transfer medium flows from the flow passage 17a to the flow passage 17d. In the first distribution valve 12, the pressure loss of the first heat transfer medium is constant irrespective of the ratio at which the first heat transfer medium supplied from the first chiller 11 is distributed between the three first flow-through sections 14 and the flow passage 17d.

The flowmeter 13 is provided in the flow passage 17b. The flowmeter 13 measures the flow rate of the first heat transfer medium flowing through the flow passage 17b. The flow passage 17b is branched into three (a plurality of) flow passages 17c. The flow passages 17c are connected to the respective first flow-through sections 14. The three first flow-through sections 14 are provided in the heat exchanger 31, and the first heat transfer medium flows through the three first flow-through sections 14.

Flow passages 18a are connected to the respective first flow-through sections 14. The three (a plurality of) flow passages 18a merge into a flow passage 18b. The flow passage 17d connects the B port of the first distribution valve 12 and the flow passage 18b to each other.

The second circulation circuit 20 includes a second chiller 21, a second distribution valve 22, a flowmeter 23, three (a plurality of) second flow-through sections 24, etc.

The second chiller 21 (second adjustment apparatus) includes a tank 21a, a pump 21b, etc. A flow passage 27a is connected to the common port (COM) of the second distribution valve 22.

The second distribution valve 22 (adjustment section) is a three-way valve having the common port, an A port, and a B port. A flow passage 27b is connected to the A port. A flow passage 27d is connected to the B port. The second distribution valve 22 continuously changes the ratio between the flow rate of the second heat transfer medium flowing from the flow passage 27a to the flow passage 27b and the flow rate of the second heat transfer medium flowing from the flow passage 27a to the flow passage 27d. The second distribution valve 22 continuously changes the state of flow between a state in which all (100%) of the second heat transfer medium flows from the flow passage 27a to the flow passage 27b and a state in which all (100%) of the second heat transfer medium flows from the flow passage 27a to the flow passage 27d. In the second distribution valve 22, the pressure loss of the second heat transfer medium is constant irrespective of the ratio at which the second heat transfer medium supplied from the second chiller 21 is distributed between the three second flow-through sections 24 and the flow passage 27d.

The flowmeter 23 is provided in the flow passage 27b. The flowmeter 23 measures the flow rate of the second heat transfer medium flowing through the flow passage 27b. The flow passage 27b is branched into three (a plurality of) flow passages 27c. The flow passages 27c are connected to the respective second flow-through sections 24. The three second flow-through sections 24 are provided in the heat exchanger 31, and the second heat transfer medium flows through the three second flow-through sections 24.

Flow passages 28a are connected to the second flow-through sections 24. The three flow passages 28a merge into a flow passage 28b. The flow passage 27d connects the B port of the second distribution valve 22 and the flow passage 28b to each other.

The third circulation circuit 30 includes five (a plurality of) common flow-through sections 34, a pump 32, etc.

The five common flow-through sections 34 (third flow-through section, fourth flow-through section) are provided in the heat exchanger 31, and the third heat transfer medium flows through the common flow-through sections 34. The common flow-through sections 34 are integrated with the first flow-through sections 14 and the second flow-through sections 24. Heat exchange is performed between the common flow-through sections 34 and the first flow-through sections 14, and heat exchange is performed between the common flow-through sections 34 and the second flow-through sections 24.

Flow passages 35a are connected to the respective common flow-through sections 34. The five (a plurality of) flow passages 35a merge into a flow passage 35b.

The heat exchanger 93 (heat exchange section) is connected to the above-described flow passage 35b, and the third heat transfer medium flows through the heat exchanger 93. A flow passage 36b is connected to the heat exchanger 93. The pump 32 is provided in the flow passage 36b. The flow passage 36b is branched to five (a plurality of) flow passages 36c. The flow passages 36c are connected to the respective common flow-through sections 34.

In the flow passage 36b, the pump 32 sucks the third heat transfer medium from the heat exchanger 93 side and discharges the third heat transfer medium toward the common flow-through sections 34. The pump 32 is driven in a constant drive state. As a result, the pump 32 circulates the third heat transfer medium through the third circulation circuit 30. The third circulation circuit 30 does not include a tank for storing the third heat transfer medium.

The control section 80 controls the distribution ratios of the first distribution valve 12 and the second distribution valve 22 on the basis of the target temperature Te of the lower electrode 92 and the results of the detections performed by the flowmeters 13 and 23 and the temperature sensor 94. Thus, the flow rate of the first heat transfer medium flowing through the first flow-through sections 14 is adjusted; as a result, the amount of heat exchanged between the first flow-through sections 14 and the common flow-through sections 34 (third flow-through section) is adjusted.

Also, the flow rate of the second heat transfer medium flowing through the second flow-through sections 24 is adjusted; as a result, the amount of heat exchanged between the second flow-through sections 24 and the common flow-through sections 34 (fourth flow-through section) is adjusted.

Figure 11:
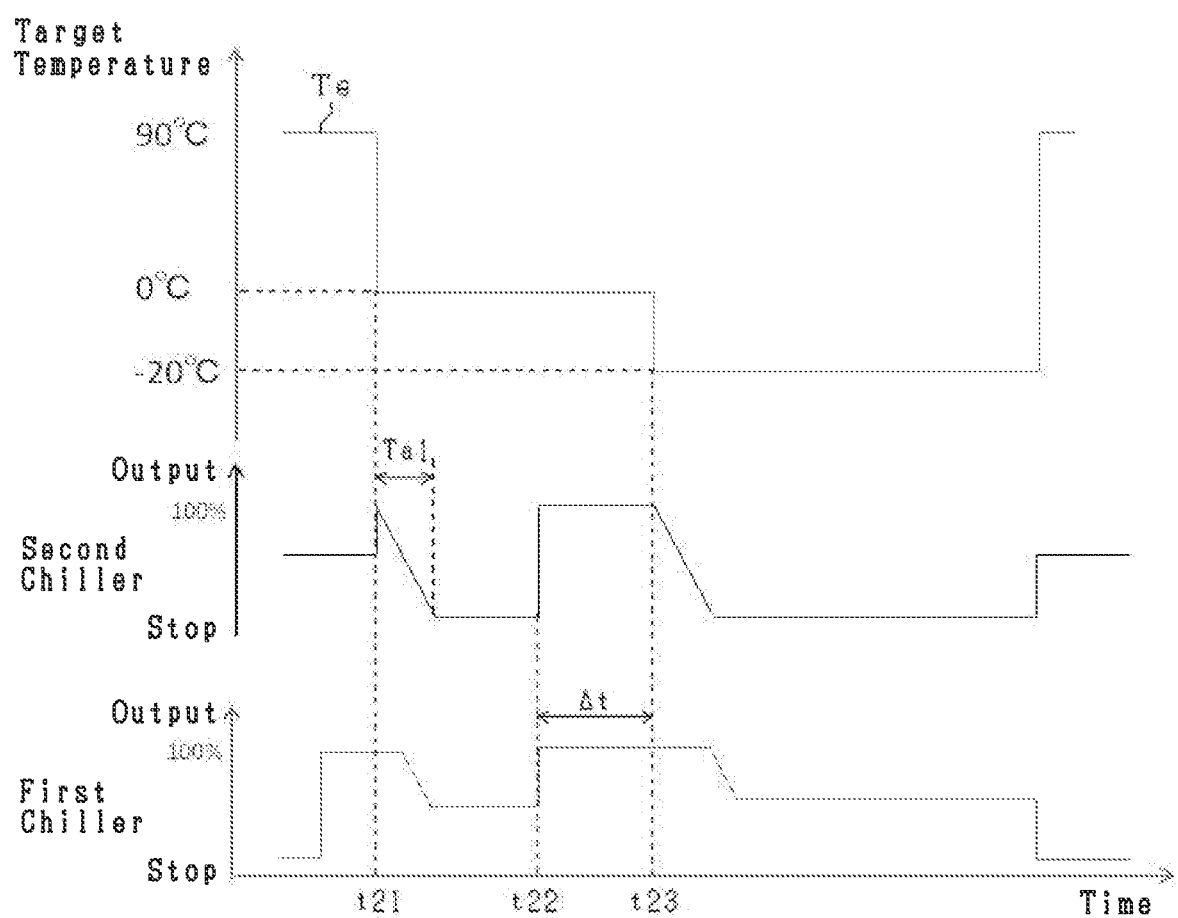
FIG. 11 is a time chart showing changes in the target temperature of the lower electrode, the output of the first chiller, and the output of the second chiller.

FIG. 11 is a time chart showing changes in the target temperature Te of the lower electrode 92, the output of the first chiller 11, and the output of the second chiller 21. As shown in FIG. 11, the target temperature Te of the lower electrode 92 changes in the same manner as in FIG. 2.

In the same manner as in the fourth embodiment, the control section 80 allows and stops the supply of the first heat transfer medium from the first chiller 11 and the second chiller 21 in accordance with the changing target temperature Te. In the same manner as in the fourth embodiment, the control section 80 sets the set temperature Tc of the first chiller 11 to a set temperature Tc corresponding to the target temperature Te. Subsequently, the control section 80 feedback-controls the output of the first chiller 11 such that the temperature T1 of the first heat transfer medium detected by the temperature sensor 19 becomes equal to the set temperature Tc. Also, the control section 80 feedback-controls the distribution ratio of the first distribution valve 12 such that the temperature T3 of the lower electrode 92 detected by the temperature sensor 94 becomes equal to the target temperature Te. The control section 80 also controls the second chiller 21 and the second distribution valve 22 in the same manner as in the fourth embodiment.

Further, only during an assist period Ta1 starting at time t21 (the first change timing), the control section 80 sets the set temperature Th (second set temperature) of the second chiller 21 to a set temperature Th2 (for example, −5° C.) corresponding to the post-change target temperature Te2 (=0° C.) and operates the second chiller 21 such that its output decreases gradually from 100%. The control section 80 supplies the second heat transfer medium from the second chiller 21 to the second flow-through sections 24.

At time t22 which precedes, by the predetermined time Δt, time t23 (the first change timing) at which the target temperature Te changes to the target temperature Te3 (=−20° C.) which is to be reached by supplying the first heat transfer medium from the first chiller 11 to the first flow-through sections 14, the control section 80 sets the set temperature Tc to a set temperature Tc3 (for example, −25° C.) corresponding to the post-change target temperature Te3 (=−20° C.) and operates the first chiller 11 such that its output become 100%. In such a case, more time (the predetermined time Δt) may be required to store in the tank 11a the first heat transfer medium whose temperature has been adjusted beforehand, while controlling the temperature of the lower electrode 92 to the target temperature Te2 (=0° C.)

In view of the above, during the period between time t22 (which precedes time t23 by the predetermined time Δt) and time t23, the control section 80 sets the set temperature Th to a set temperature Th2 (for example, −25° C.) corresponding to the pre-change target temperature Te2 (=0° C.) and operates the second chiller 21 such that its output become 100%, thereby supplying the second heat transfer medium from the second chiller 21 to the second flow-through sections 24. At that time, until the second heat transfer medium of −25° C. is stored in the tank 21a of the second chiller 21, the second distribution valve 22 is operated such that the second heat transfer medium does not flow to the flow passage 27b and flows to the flow passage 27d, and after the second heat transfer medium of −25° C. has been stored in the tank 21a of the second chiller 21, the second distribution valve 22 is operated such that the second heat transfer medium flows to the flow passage 27b. Notably, in the case where the second heat transfer medium is a liquid different from the first heat transfer medium and may freeze when cooled to −25° C., the set temperature Th2 corresponding to the target temperature Te2 (=0° C.) may set to −10° C.

The present embodiment having been described in detail above has the following advantages. Notably, only the advantages different from those of the first, fourth, and fifth embodiments will be described.

When the first heat transfer medium is supplied from the first chiller 11 to the first flow-through sections 14 at time t21 so as to control the temperature of the lower electrode 92 to the post-change target temperature Te2 (=0° C.), the temperature control can be assisted by supplying the second heat transfer medium from the second chiller 21 to the second flow-through sections 24. Therefore, the followability of the temperature of the lower electrode 92 to the target temperature Te2 (=0° C.) can be enhanced further.

When, in the period between times t22 and t23, the set temperature Tc of the first chiller 11 is set to the set temperature Tc3 (=−25° C.) corresponding to the post-change target temperature Te3 (=−20° C.) and the temperature of the lower electrode 92 is controlled to the pre-change target temperature Te2 (=0° C.) by supplying the first heat transfer medium from the first chiller 11 to the first flow-through sections 14, the temperature control can be assisted by supplying the second heat transfer medium from the second chiller 21 to the second flow-through sections 24. Therefore, it is possible to prevent the above-described predetermined time Δt from becoming longer.

The above-described embodiments may be modified as follows. Portions identical with those of the above-described embodiments are denoted by the same reference numerals, and their description will not be repeated.

The memory device 80a (memory section) may be provided outside the control section 80 and be connected to the control section 80.

In the fifth, sixth, and eighth embodiments, the first heat transfer medium and the second heat transfer medium may be different liquids. For example, the first heat transfer medium and the second heat transfer medium may differ from each other in the ratio between ethylene glycol and water. Also, the first heat transfer medium and the second heat transfer medium may be formed of different substances. However, the first heat transfer medium and the second heat transfer medium may be less expensive than the third heat transfer medium.

The predetermined time Δt during which the heat transfer medium adjusted to a set temperature Tc (Th) corresponding to the post-change target temperature Te is stored in the tank 11a (21a) may be fixed to a certain time. By virtue of such a configuration, the predetermined time Δt can be set simply.

The control target is not limited to the lower electrode 92 and may be the upper electrode 91 of the semiconductor manufacturing apparatus 90. Also, the above-described temperature control systems can be applied not only to the semiconductor manufacturing apparatus 90 but also to other manufacturing apparatuses, processing apparatuses, etc.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

What is claimed is:

1. A temperature control system for controlling a temperature of a control target to a target temperature that changes with lapse of time, the system comprising:
  a first adjustment apparatus that:
    comprises a first tank that stores a first heat transfer medium,
    adjusts a temperature of the first heat transfer medium to a first set temperature, and supplies the temperature-adjusted first heat transfer medium;
  a temperature sensor that detects the temperature of the first heat transfer medium supplied from the first adjustment apparatus;
  a first circulation circuit through which the first heat transfer medium flows from the first adjustment apparatus to a first flow-through path and returns to the first adjustment apparatus, wherein the first flow-through path supplies heat to the control target;
  an adjustment section that adjusts an amount of the heat supplied from the first flow-through path to the control target;
  a memory that stores a relation between the lapse of time and the target temperature; and
  a controller that:
    sets, at a first point in time and based on the stored relation, the first set temperature to a post-change target temperature, wherein the post-change target temperature is the target temperature after a first change timing at which the target temperature changes, and the first point in time precedes the first change timing by a predetermined time, and
    causes the adjustment section to adjust the amount of heat and controls the temperature of the control target to a pre-change target temperature until the first change timing, wherein the pre-change target temperature is the target temperature before the first change timing.

2. The temperature control system according to claim 1, wherein the controller sets the predetermined time based on:
  the post-change target temperature,
  the temperature of the first heat transfer medium detected by the temperature sensor,
  a heat capacity of heat supplied from the first adjustment apparatus to the control target, and
  an operating state of the first adjustment apparatus.

3. The temperature control system according to claim 2, wherein the controller:
  sets the predetermined time for a condition where the first adjustment apparatus is operated to produce maximum output, and
  operates the first adjustment apparatus to produce the maximum output during a period from the first point in time to the first change timing.

4. The temperature control system according to claim 2, wherein the controller:
  sets the predetermined time for a condition where the first adjustment apparatus is operated at maximum efficiency, and
  operates the first adjustment apparatus at the maximum efficiency during a period from the first point in time to the first change timing.

5. The temperature control system according to claim 1, wherein the adjustment section comprises:
   a first distribution valve that changes a ratio between:
      the first heat transfer medium flowing from the first adjustment apparatus to the first flow-through path, and
      the first heat transfer medium flowing out of the first adjustment apparatus and returning to the first adjustment apparatus without flowing through the first flow-through path.

6. The temperature control system according to claim 5, further comprising:
   a second adjustment apparatus that adjusts a temperature of a second heat transfer medium to a second set temperature and supplies the temperature-adjusted second heat transfer medium; and
   a second circulation circuit through which the second heat transfer medium flows from the second adjustment apparatus to a second flow-through path and returns to the second adjustment apparatus, wherein the second flow-through path supplies heat to the control target,
   wherein the adjustment section adjusts amounts of heat supplied from the first flow-through path and the second flow-through path to the control target, and
   wherein at the first change timing, the target temperature changes to the first target temperature by supplying the first heat transfer medium from the first adjustment apparatus to the first flow through path.

7. The temperature control system according to claim 6, wherein during an assist period starting at the first change timing, the controller:
   sets the second set temperature to the first post-change target temperature, and causes the second adjustment apparatus to supply the second heat transfer medium to the second flow-through path.

8. The temperature control system according to claim 6, wherein during a period from the first point in time to the first change timing, the controller:
   sets the second set temperature to the pre-change target temperature, and causes the second adjustment apparatus to supply the second heat transfer medium to the second flow-through path.

9. The temperature control system according to claim 6,
   wherein a common heat transfer medium is used as both the first heat transfer medium and th second heat transfer medium,
   wherein a common flow-through path is used as both the first flow-through path and the second flow-through path, and
   wherein the adjustment section further comprises:
      a second distribution valve that changes a ratio between the common heat transfer medium flowing from the common flow-through path to the first adjustment apparatus, and the common heat transfer medium flowing from the common flow-through path to the second adjustment apparatus.

10. The temperature control system according to claim 6,
    wherein a common heat transfer medium is used as both the first heat transfer medium and the second heat transfer medium,
    wherein a common flow-through path is used as both the first flow-through path and the second flow-through path, and
    wherein the adjustment section further comprises:
       a third distribution valve that changes a ratio among:
          the common heat transfer medium flowing from the common flow-through path to the first adjustment apparatus,
          the common heat transfer medium flowing out of the common flow-through path and returning to the common flow-through path without flowing through the first adjustment apparatus and the second adjustment apparatus, and
          the common heat transfer medium flowing from the common flow-through path to the second adjustment apparatus.

11. The temperature control system according to claim 6,
    wherein the second circulation circuit is independent of the first circulation circuit,
    wherein the temperature control system further comprises:
       a third circulation circuit that is independent of the first circulation circuit and the second circulation circuit and through which a third heat transfer medium circulates, wherein the third heat transfer medium has a usable temperature range wider than usable temperature ranges of the first heat transfer medium and the second heat transfer medium circulates,
    wherein the third circulation circuit comprises:
       a third flow-through path through which the third heat transfer medium flows and that exchanges heat with the first flow-through path; and
       a fourth flow-through path through which the third heat transfer medium flows and that exchanges heat with the second flow-through path,
    wherein the third circulation circuit does not comprise a tank that stores the third heat transfer medium,
    wherein the third heat transfer medium flows from the third flow-through path and the fourth flow-through path to a heat exchanger and returns to the third flow-through path and the fourth flow-through path, wherein the heat exchanger exchanges heat with the control target, and
    wherein the adjustment section further comprises:
       a fourth distribution valve that changes a ratio between the third heat transfer medium flowing from the heat exchanger to the third flow-through path, and the third heat transfer medium flowing from the heat exchanger to the fourth flow-through path.

12. The temperature control system according to claim 6,
    wherein the second circulation circuit is independent of the first circulation circuit,
    wherein the temperature control system further comprises:
       a third circulation circuit that is independent of the first circulation circuit and the second circulation circuit and through which a third heat transfer medium circulates, wherein the third heat transfer medium has a usable temperature range wider than usable temperature ranges of the first heat transfer medium and the second heat transfer medium,
    wherein the third circulation circuit comprises:
       a third flow-through path through which the third heat transfer medium flows and that exchanges heat with the first flow-through path; and
       a fourth flow-through path through which the third heat transfer medium flows and that exchanges heat with the second flow-through path,
    wherein the third circulation circuit does not comprise a tank that stores the third heat transfer medium, wherein the third heat transfer medium flows from the third flow-through path and the fourth flow-through path to a heat exchanger and returns to the third flow-through path and the fourth flow-through path, wherein the heat exchanger exchanges heat with the control target, and wherein the adjustment section further comprises:
  a fifth distribution valve that changes a ratio among:
    the third heat transfer medium flowing from the heat exchanger to the third flow-through path,
    the third heat transfer medium flowing out of the heat exchanger and returning to the heat exchanger without flowing through the third flow-through path and the fourth flow-through path, and
    and the third heat transfer medium flowing from the heat exchanger to the fourth flow-through path.

13. The temperature control system according to claim 1, further comprising:
  a second adjustment apparatus that adjusts a temperature of a second heat transfer medium to a second set temperature and supplies the temperature-adjusted second heat transfer medium; and
  a second circulation circuit through which the second heat transfer medium flows from the second adjustment apparatus to a second flow-through path and returns to the second adjustment apparatus, wherein the second flow-through path supplies heat to the control target,
  wherein the adjustment section adjusts amounts of heat supplied from the first flow-through path and the second flow-through path to the control target, and
  wherein at the first change timing, the target temperature changes to the first target temperature by supplying the first heat transfer medium from the first adjustment apparatus to the first flow through path.

14. The temperature control system according to claim 13, wherein during an assist period starting at the first change timing, the controller:
  sets the second set temperature to the first post-change target temperature, and causes the second adjustment apparatus to supply the second heat transfer medium to the second flow-through path.

15. The temperature control system according to claim 13, wherein during a period from the first point in time to the first change timing, the controller:
  sets the second set temperature to the pre-change target temperature, and causes the second adjustment apparatus to supply the second heat transfer medium to the second flow-through path.

16. The temperature control system according to claim 13, wherein a common heat transfer medium is used as both the first heat transfer medium and the second heat transfer medium,
  wherein a common flow-through path is used as both the first flow-through path and the second flow-through path, and
  wherein the adjustment section comprises:
    a third distribution valve that changes a ratio among:
      the common heat transfer medium flowing from the common flow-through path to the first adjustment apparatus,
      the common heat transfer medium flowing out of the common flow-through path and returning to the common flow-through path without flowing through the first adjustment apparatus and the second adjustment apparatus, and
      the common heat transfer medium flowing from the common flow-through path to the second adjustment apparatus.

17. The temperature control system according to claim 13, wherein the second circulation circuit is independent of the first circulation circuit,
wherein the temperature control system further comprises:
  a third circulation circuit that is independent of the first circulation circuit and the second circulation circuit and through which a third heat transfer medium circulates, wherein the third heat transfer medium has a usable temperature range wider than usable temperature ranges of the first heat transfer medium and the second heat transfer medium,
wherein the third circulation circuit comprises:
  a third flow-through path through which the third heat transfer medium flows and that exchanges heat with the first flow-through path; and
  a fourth flow-through path through which the third heat transfer medium flows and that exchanges heat with the second flow-through path,
wherein the third circulation circuit does not comprise a tank that stores the third heat transfer medium,
wherein the third heat transfer medium flows from the third flow-through path and the fourth flow-through path to a heat exchanger and returns to the third flow-through path and the fourth flow-through path, wherein the heat exchanger exchanges heat with the control target, and
wherein the adjustment section comprises:
  a fourth distribution valve that changes a ratio between the third heat transfer medium flowing from the heat exchanger to the third flow-through path, and the third heat transfer medium flowing from the heat exchanger to the fourth flow-through path.

18. The temperature control system according to claim 13, wherein the second circulation circuit is independent of the first circulation circuit,
wherein the temperature control system further comprises:
  a third circulation circuit that is independent of the first circulation circuit and the second circulation circuit and through which a third heat transfer medium circulates, wherein the third heat transfer medium has a usable temperature range wider than usable temperature ranges of the first heat transfer medium and the second heat transfer medium,
wherein the third circulation circuit comprises:
  a third flow-through path through which the third heat transfer medium flows and that exchanges heat with the first flow-through path; and
  a fourth flow-through path through which the third heat transfer medium flows and that exchanges heat with the second flow-through path,
wherein the third circulation circuit does not comprise a tank that stores the third heat transfer medium,
wherein the third heat transfer medium flows from the third flow-through path and the fourth flow-through path to a heat exchanger and returns to the third flow-through path and the fourth flow-through path, wherein the heat exchanger exchanges heat with the control target, and
wherein the adjustment section comprises:
  a fifth distribution valve that changes a ratio among:
    the third heat transfer medium flowing from the heat exchanger to the third flow-through path, the third heat transfer medium flowing out of the heat exchanger and returning to the heat exchanger without flowing through the third flow-through path and the fourth flow-through path, and the third heat transfer medium flowing from the heat exchanger to the fourth flow-through path.

\* \* \* \* \*